(12) United States Patent
Jeon et al.

(10) Patent No.: US 11,791,295 B2
(45) Date of Patent: Oct. 17, 2023

(54) SEMICONDUCTOR PACKAGE WITH THICK UNDER-BUMP TERMINAL

(71) Applicant: Samsung Electronics Co., Ltd., Suwon-si (KR)

(72) Inventors: Gwangjae Jeon, Hwaseong-si (KR); Dongkyu Kim, Anyang-si (KR); Jung-Ho Park, Cheonan-si (KR); Yeonho Jang, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 16/795,733

(22) Filed: Feb. 20, 2020

(65) Prior Publication Data

US 2021/0028137 A1 Jan. 28, 2021

(30) Foreign Application Priority Data

Jul. 22, 2019 (KR) .................. 10-2019-0088551

(51) Int. Cl.
*H01L 21/768* (2006.01)
*H01L 23/522* (2006.01)
(Continued)

(52) U.S. Cl.
CPC ........ *H01L 24/11* (2013.01); *H01L 21/76885* (2013.01); *H01L 23/3114* (2013.01); *H01L 23/3128* (2013.01); *H01L 23/49816* (2013.01); *H01L 23/49827* (2013.01); *H01L 24/05* (2013.01); *H01L 24/13* (2013.01); *H01L 2224/023* (2013.01); *H01L 2224/0401* (2013.01); *H01L 2224/04105* (2013.01)

(58) Field of Classification Search
CPC ............... H01L 24/11; H01L 21/76885; H01L 23/3114; H01L 23/3128; H01L 23/49816; H01L 23/49827; H01L 24/05; H01L 24/13; H01L 2224/023; H01L 2224/0401; H01L 2224/04105
See application file for complete search history.

(56) References Cited

U.S. PATENT DOCUMENTS 6,621,164 B2 9/2003 Hwang et al.
7,064,012 B1 * 6/2006 Lin .................. H01L 23/49816
257/E21.175

(Continued)

FOREIGN PATENT DOCUMENTS

| CN | 106252315 A | 12/2016 |
| KR | 1020010003445 A | 1/2001 |
| KR | 101761914 B1 | 7/2017 |

*Primary Examiner* — Marcos D. Pizarro
*Assistant Examiner* — Tenley H Schofield
(74) *Attorney, Agent, or Firm* — Muir Patent Law, PLLC

(57) ABSTRACT

Disclosed is a semiconductor package comprising a redistribution substrate, and a semiconductor chip on a top surface of the redistribution substrate. The redistribution substrate includes an under-bump pattern, a lower dielectric layer that covers a sidewall of the under-bump pattern, and a first redistribution pattern on the lower dielectric layer. The first redistribution pattern includes a first line part. A width at a top surface of the under-bump pattern is greater than a width at a bottom surface of the under-bump pattern. A thickness of the under-bump pattern is greater than a thickness of the first line part.

19 Claims, 36 Drawing Sheets

(51) Int. Cl.

| | | |
|---|---|---|
| *H01L 23/00* | (2006.01) | |
| *H01L 23/31* | (2006.01) | |
| *H01L 23/495* | (2006.01) | |
| *H01L 23/528* | (2006.01) | |
| *H01L 23/532* | (2006.01) | |
| *H01L 23/498* | (2006.01) | |

(56) References Cited

U.S. PATENT DOCUMENTS

| | | | | |
|---|---|---|---|---|
| 7,855,461 | B2 * | 12/2010 | Kuo | H01L 24/48 |
| | | | | 257/780 |
| 7,906,849 | B2 * | 3/2011 | Lee | H01L 21/76838 |
| | | | | 257/759 |
| 8,017,515 | B2 | 9/2011 | Marimuthu et al. | |
| 9,293,403 | B2 | 3/2016 | Park et al. | |
| 9,887,148 | B1 * | 2/2018 | Huang | H01L 23/3121 |
| 10,109,607 | B2 | 10/2018 | Chen et al. | |
| 10,163,798 | B1 * | 12/2018 | Alur | H01L 24/16 |
| 2005/0006790 | A1 * | 1/2005 | Huang | H01L 24/11 |
| | | | | 257/779 |
| 2006/0030139 | A1 * | 2/2006 | Mis | H01L 24/03 |
| | | | | 438/612 |
| 2013/0161836 | A1 * | 6/2013 | Yeom | H01L 23/49827 |
| | | | | 257/778 |
| 2014/0061888 | A1 * | 3/2014 | Lin | H01L 23/49894 |
| | | | | 438/118 |
| 2015/0181703 | A1 * | 6/2015 | Tanaka | H05K 1/0298 |
| | | | | 174/251 |
| 2016/0176701 | A1 * | 6/2016 | Gupta | B81B 3/001 |
| | | | | 257/254 |
| 2017/0271248 | A1 * | 9/2017 | Chen | H01L 25/0657 |
| 2018/0308800 | A1 * | 10/2018 | Tsai | H01L 21/6835 |
| 2019/0067144 | A1 * | 2/2019 | Jeng | H01L 21/4853 |
| 2019/0103387 | A1 | 4/2019 | Tsou et al. | |
| 2019/0139896 | A1 * | 5/2019 | Hsu | H01L 23/3114 |

\* cited by examiner

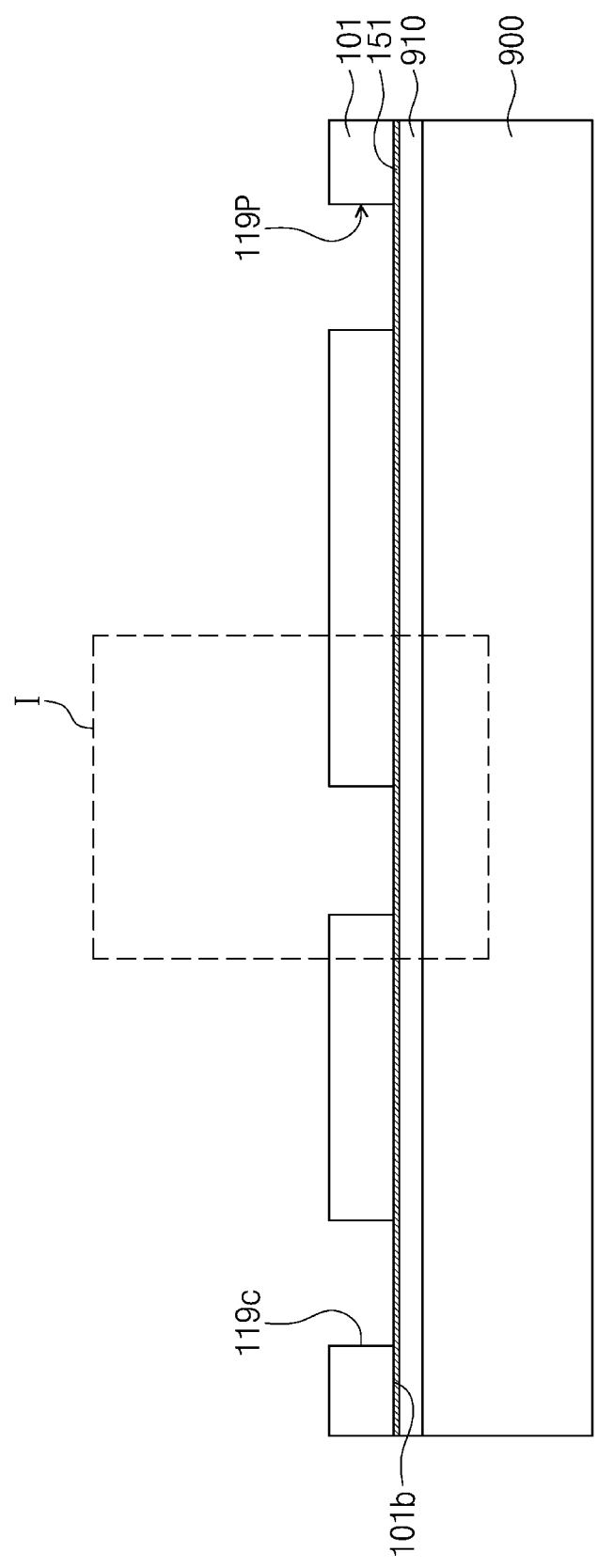

SEMICONDUCTOR PACKAGE WITH THICK UNDER-BUMP TERMINAL

CROSS-REFERENCE TO RELATED APPLICATION

This U.S. nonprovisional application claims priority under 35 U.S.C. § 119 to Korean Patent Application No. 10-2019-0088551, filed on Jul. 22, 2019, in the Korean Intellectual Property Office, the entire contents of which are hereby incorporated by reference.

BACKGROUND

The present inventive concepts relate to a semiconductor package, and more particularly, to a semiconductor package including a redistribution substrate and a method of fabricating the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some example embodiments of the present inventive concepts provide a semiconductor package with enhanced reliability and durability and a method of fabricating the same.

Some example embodiments of the present inventive concepts provide a compact-sized semiconductor package and a method of fabricating the same.

According to some example embodiments of the present inventive concepts, the disclosure is directed to a semiconductor package, comprising: a redistribution substrate; and a semiconductor chip on a top surface of the redistribution substrate, wherein the redistribution substrate includes: an under-bump pattern; a lower dielectric layer that covers a sidewall of the under-bump pattern; and a first redistribution pattern on the lower dielectric layer, the first redistribution pattern including a first line part, wherein a width at a top surface of the under-bump pattern is greater than a width at a bottom surface of the under-bump pattern, and wherein a thickness of the under-bump pattern is greater than a thickness of the first line part.

According to some example embodiments of the present inventive concepts, the disclosure is directed to a semiconductor package, comprising: a redistribution substrate; and a semiconductor chip on a top surface of the redistribution substrate, wherein the redistribution substrate includes: an under-bump pattern; a dielectric layer that covers a sidewall of the under-bump pattern; and a redistribution pattern on the under-bump pattern, the redistribution pattern being coupled to the under-bump pattern, wherein an angle between the sidewall and a bottom surface of the under-bump pattern is in a range from 105° to 135°.

According to some example embodiments of the present inventive concepts, the disclosure is directed to a semiconductor package, comprising: a redistribution substrate; and a semiconductor chip on a top surface of the redistribution substrate, wherein the redistribution substrate includes: a conductive terminal pad; a lower dielectric layer that covers a sidewall of the conductive terminal pad; a line pattern on the lower dielectric layer; and a via between the conductive terminal pad and the line pattern, the via being in contact with a top surface of the conductive terminal pad, wherein a thickness of the conductive terminal pad is greater than a thickness of the line pattern, and wherein a width of the via is less than a width of the conductive terminal pad.

BRIEF DESCRIPTION OF THE DRAWINGS

FIGS. 1A, 1C, 1E, 1G, 1H, 1I, 1K, 1L, 1M, 1O, and 1Q illustrate cross-sectional views showing a method of fabricating a semiconductor package according to some example embodiments.

FIG. 1L illustrates an enlarged view showing section I of FIG. 1K.

DETAILED DESCRIPTION OF EMBODIMENTS

Figure 1B:
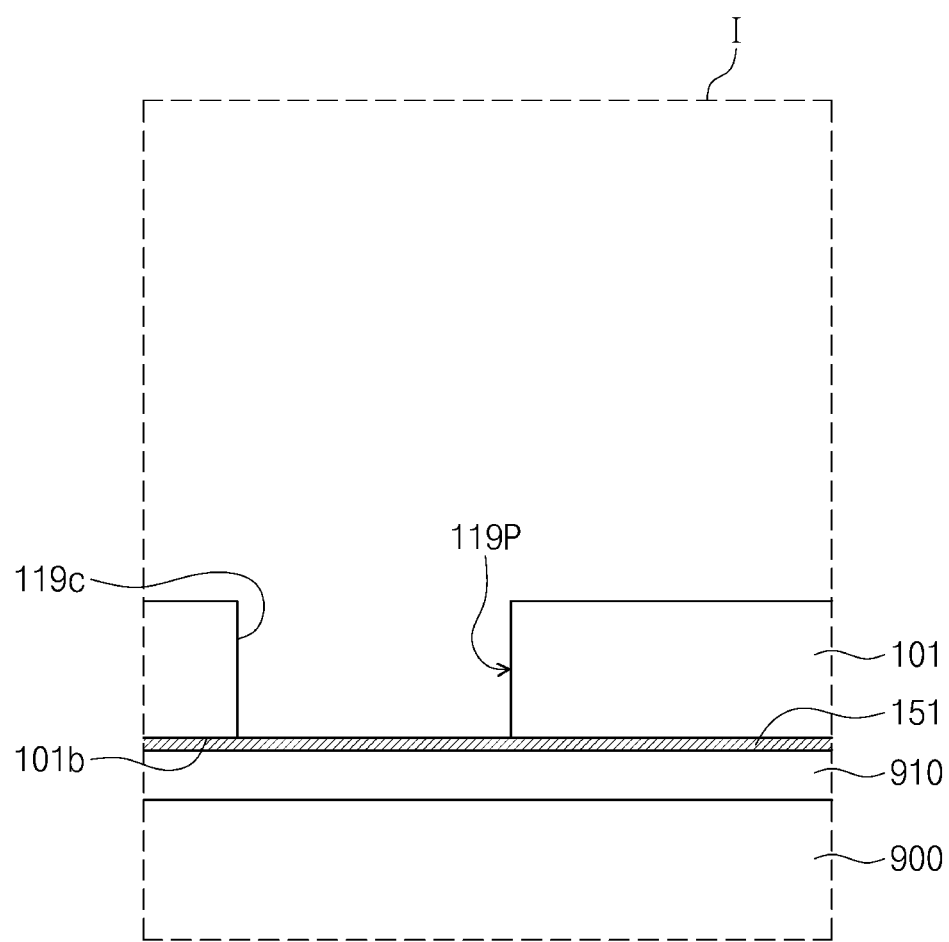
FIG. 1B illustrates an enlarged view showing section I of FIG. 1A.

In this description, like reference numerals may indicate like components. The following will now describe a semiconductor package and its fabrication method according to the present inventive concepts.

Figure 1C:
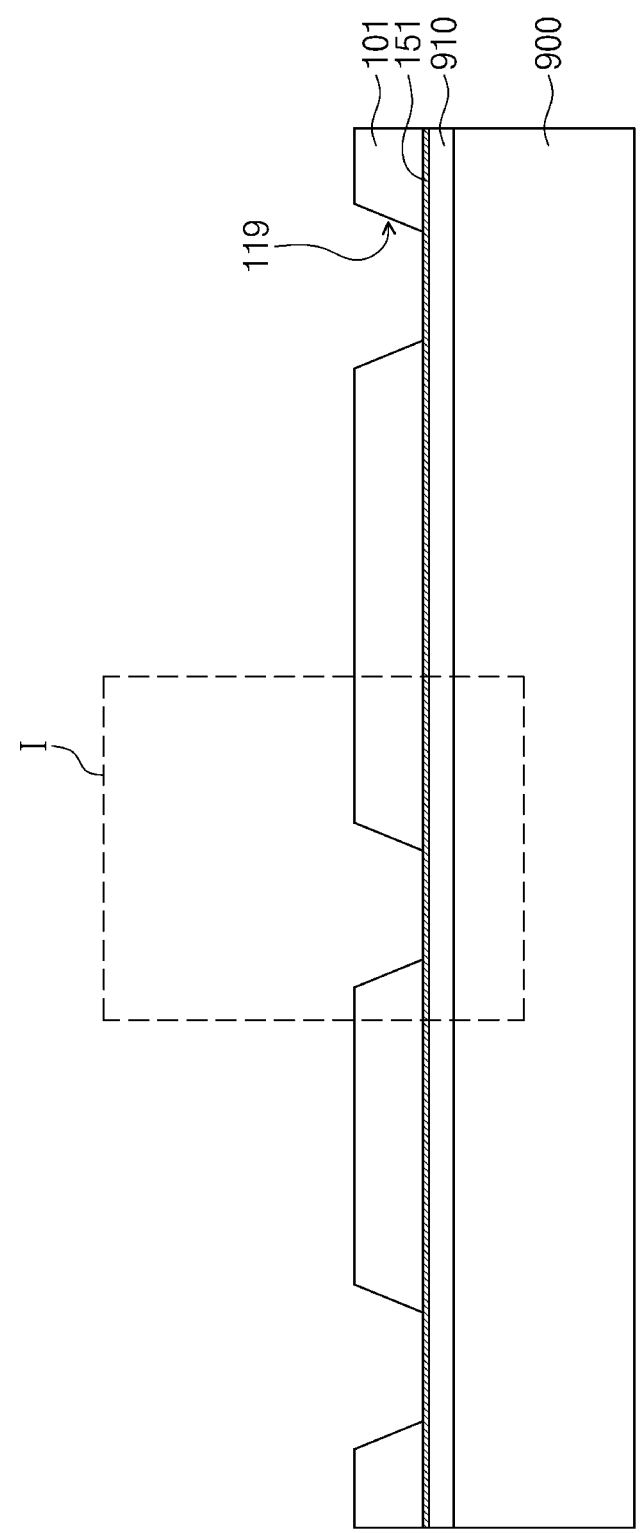
Figure 1D:
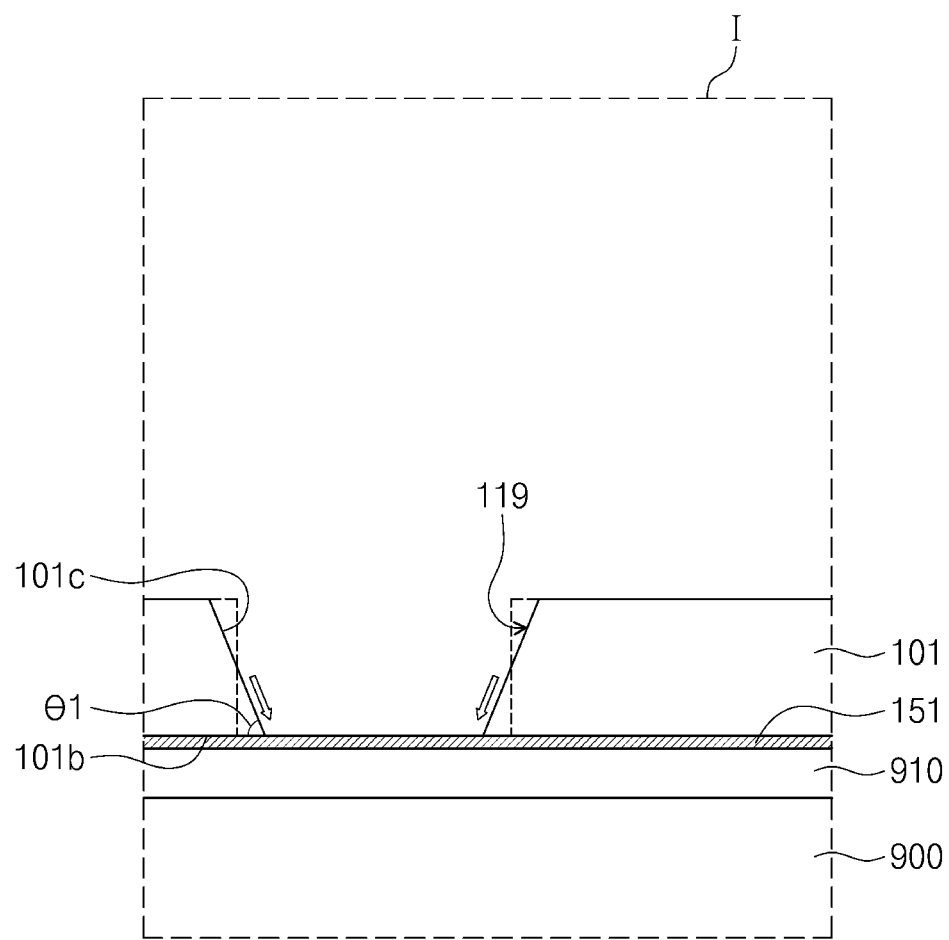
FIG. 1D illustrates an enlarged view showing section I of FIG. 1C.
Figure 1E:
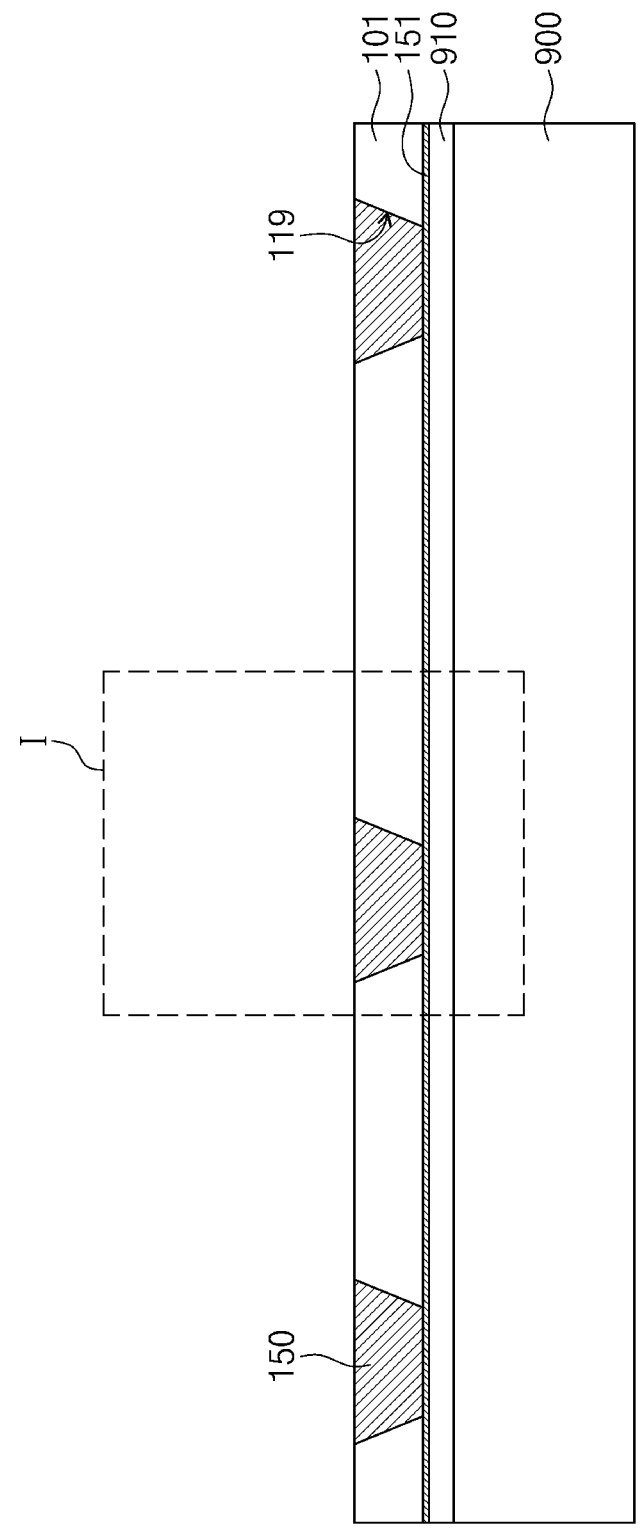
Figure 1F:
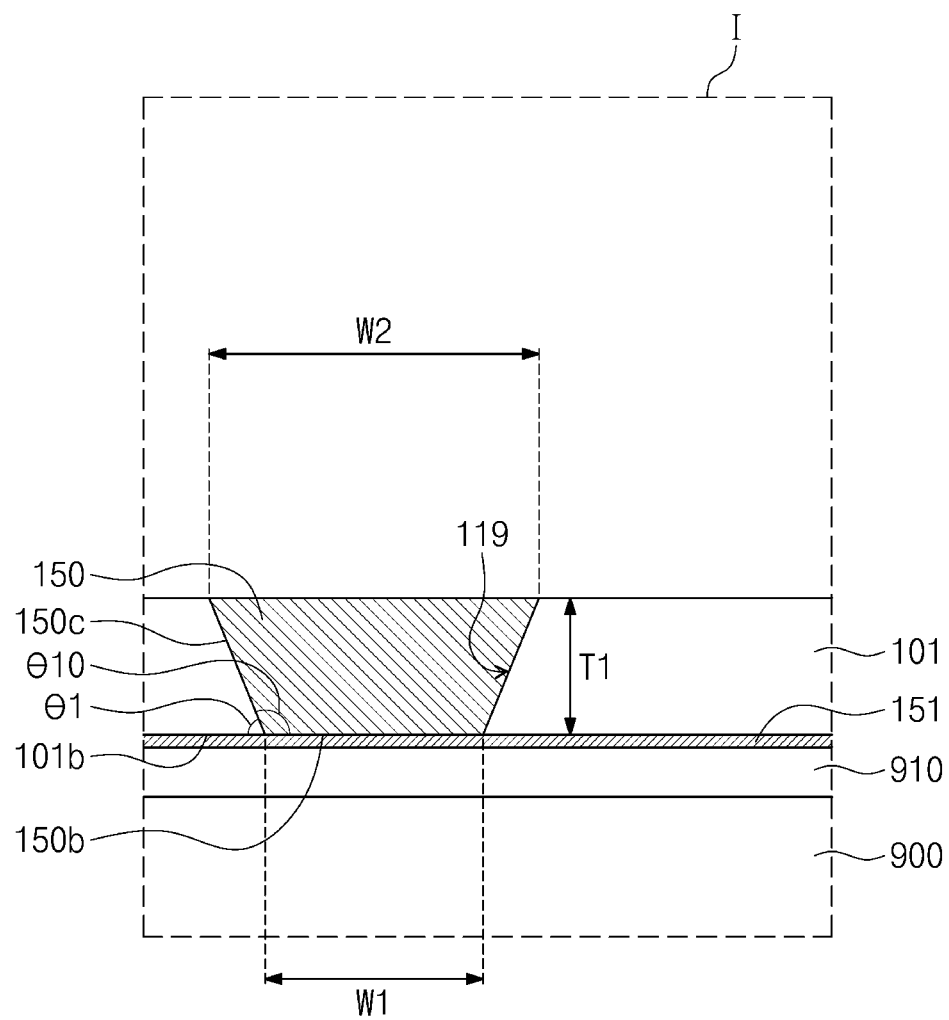
FIG. 1F illustrates an enlarged view showing section I of FIG. 1E.
Figure 1G:
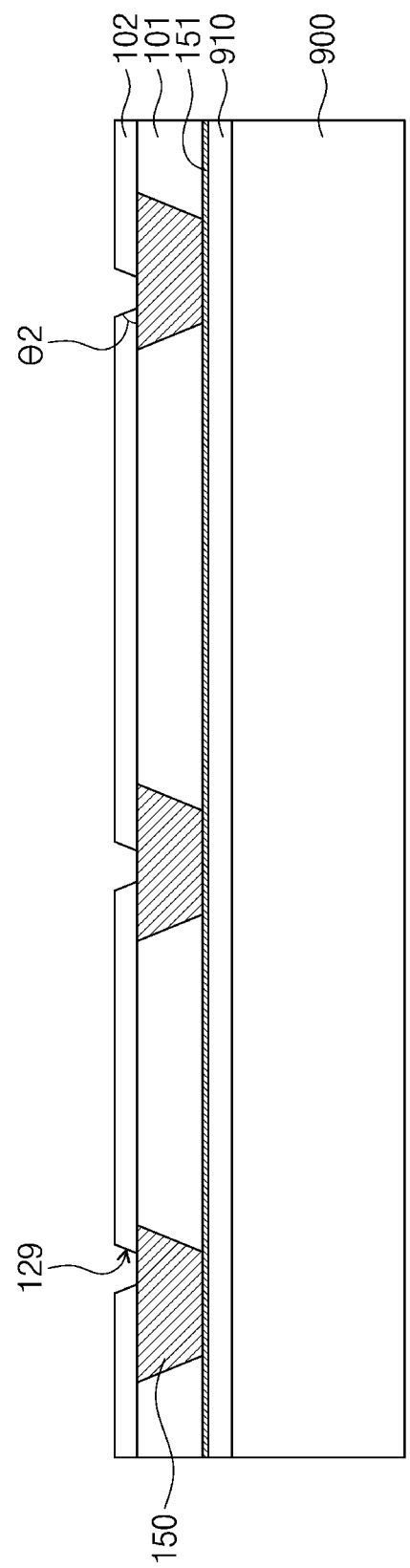
Figure 1H:
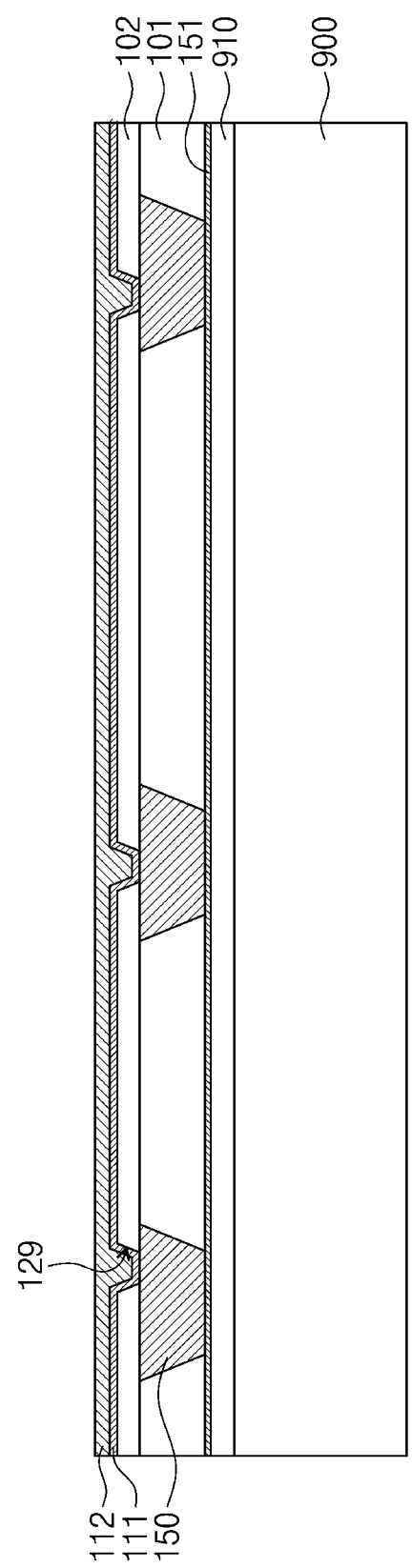
Figure 1I:
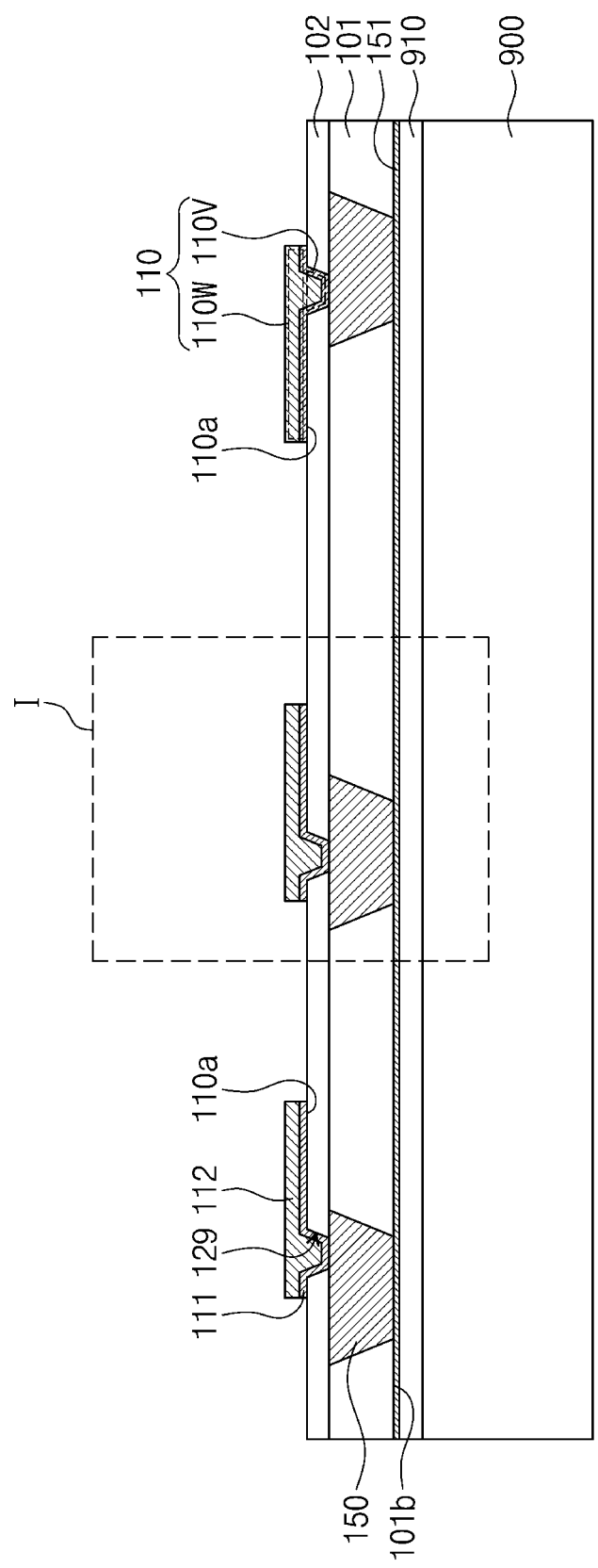
Figure 1J:
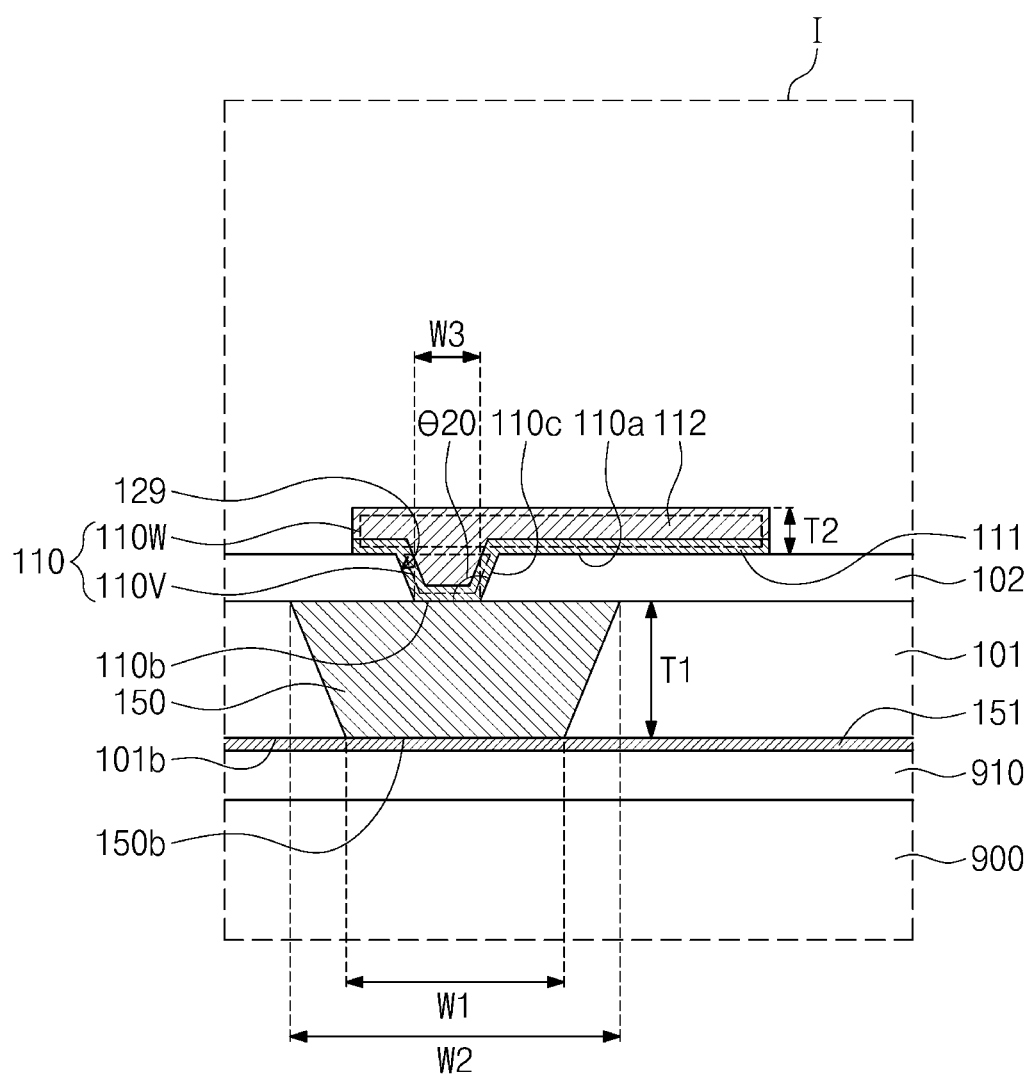
FIG. 1J illustrates an enlarged view showing section I of FIG. 1I.
Figure 1K:
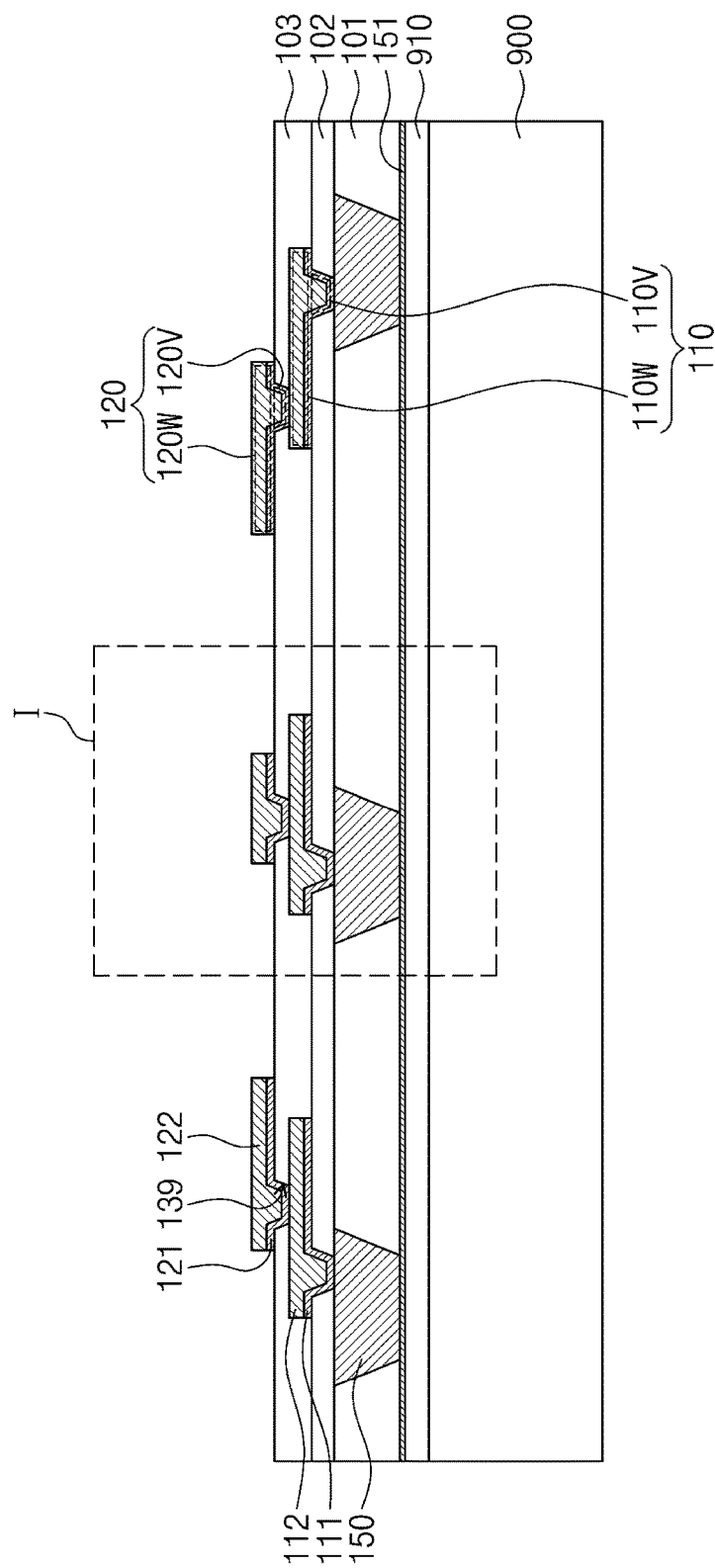
Figure 1L:
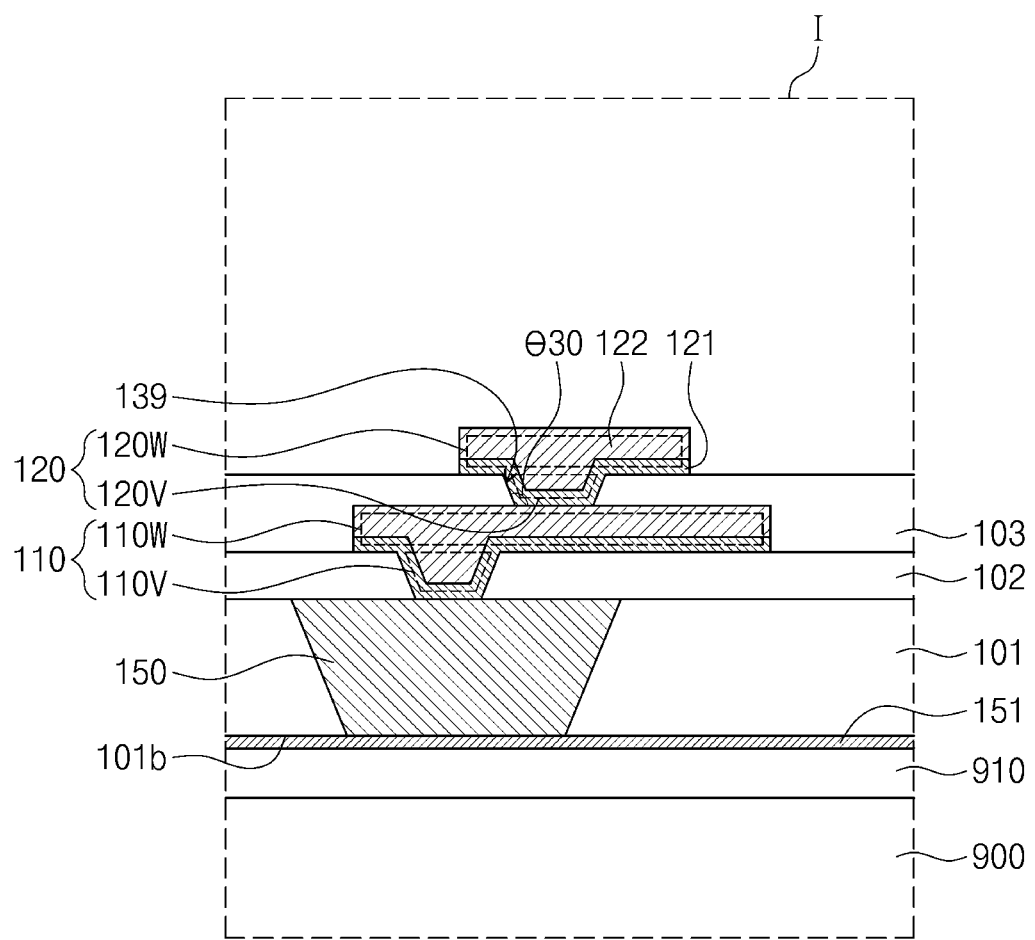

FIGS. 1A, 1C, 1E, 1G, 1H, 1I, 1K, 1L, 1M, 1O, and 1Q illustrate cross-sectional views showing a method of fabricating a semiconductor package according to some example embodiments. FIG. 1B illustrates an enlarged view showing section I of FIG. 1A. FIG. 1D illustrates an enlarged view showing section I of FIG. 1C. FIG. 1F illustrates an enlarged view showing section I of FIG. 1E. FIG. 1J illustrates an enlarged view showing section I of FIG. 1I. FIG. 1L illustrates an enlarged view showing section I of FIG. 1K. FIG. 1N illustrates an enlarged view showing section I of FIG. 1M. FIG. 1P illustrates an enlarged view showing section I of FIG. 1O. FIG. 1R illustrates an enlarged view showing section I of FIG. 1Q.

Referring to FIGS. 1A and 1B, a lower seed layer 151 and a first dielectric layer 101 may be formed on a carrier substrate 900. A release layer 910 may further be interposed between the carrier substrate 900 and the lower seed layer 151. The lower seed layer 151 may be formed on the carrier substrate 900 and may cover a top surface of the release layer 910. The lower seed layer 151 may be formed by a deposition process. The lower seed layer 151 may include a conductive material. For example, the lower seed layer 151 may include one or more of copper, titanium, and an alloy thereof. The release layer 910 may attach the lower seed layer 151 to the carrier substrate 900.

The first dielectric layer 101 may be formed on a top surface of the lower seed layer 151. For example, the first dielectric layer 101 may contact the top surface of the lower seed layer 151. The first dielectric layer 101 may be formed by a coating process, such as spin coating or slit coating. The first dielectric layer 101 may include, for example, a photosensitive polymer. The photosensitive polymer may include, for example, one or more of photosensitive polyimide, polybenzoxazole, phenolic polymer, and benzocyclobutene polymer.

The first dielectric layer 101 may be patterned to form a first preliminary opening 119P in the first dielectric layer 101. The patterning of the first dielectric layer 101 may be executed by exposure and development processes. The first preliminary opening 119P may expose the lower seed layer 151 on the release layer 910 or the carrier substrate 900. The first preliminary opening 119P may have a sidewall 119c substantially perpendicular to a bottom surface 101b of the first dielectric layer 101.

Referring to FIGS. 1C and 1D, the first dielectric layer 101 may undergo a curing process to form a first opening 119. The curing process of the first dielectric layer 101 may include a thermal curing process. During the curing process, as shown in FIG. 1D, a portion of the first dielectric layer 101 may flow toward the first preliminary opening 119P to form the first opening 119. The first opening 119 may have a tapered shape. For example, the first opening 119 may have a diameter that is greater at its top than at its bottom. The first opening 119 may have a width that is greater at its top than at its bottom. The bottom of the first opening 119 may be closer to the carrier substrate 900 than the top of the first opening 119. The first opening 119 may expose an inner wall 101c of the first dielectric layer 101. The inner wall 101c of the first dielectric layer 101 may correspond to a sidewall of the first opening 119. Because the first opening 119 has the tapered shape, an acute angle θ1 may be created between the bottom surface 101b and the inner wall 101c of the first dielectric layer 101. For example, the first dielectric layer 101 may have an angle θ1 ranging from about 45° to about 75° between the bottom surface 101b and the inner wall 101c.

Figure 1M:
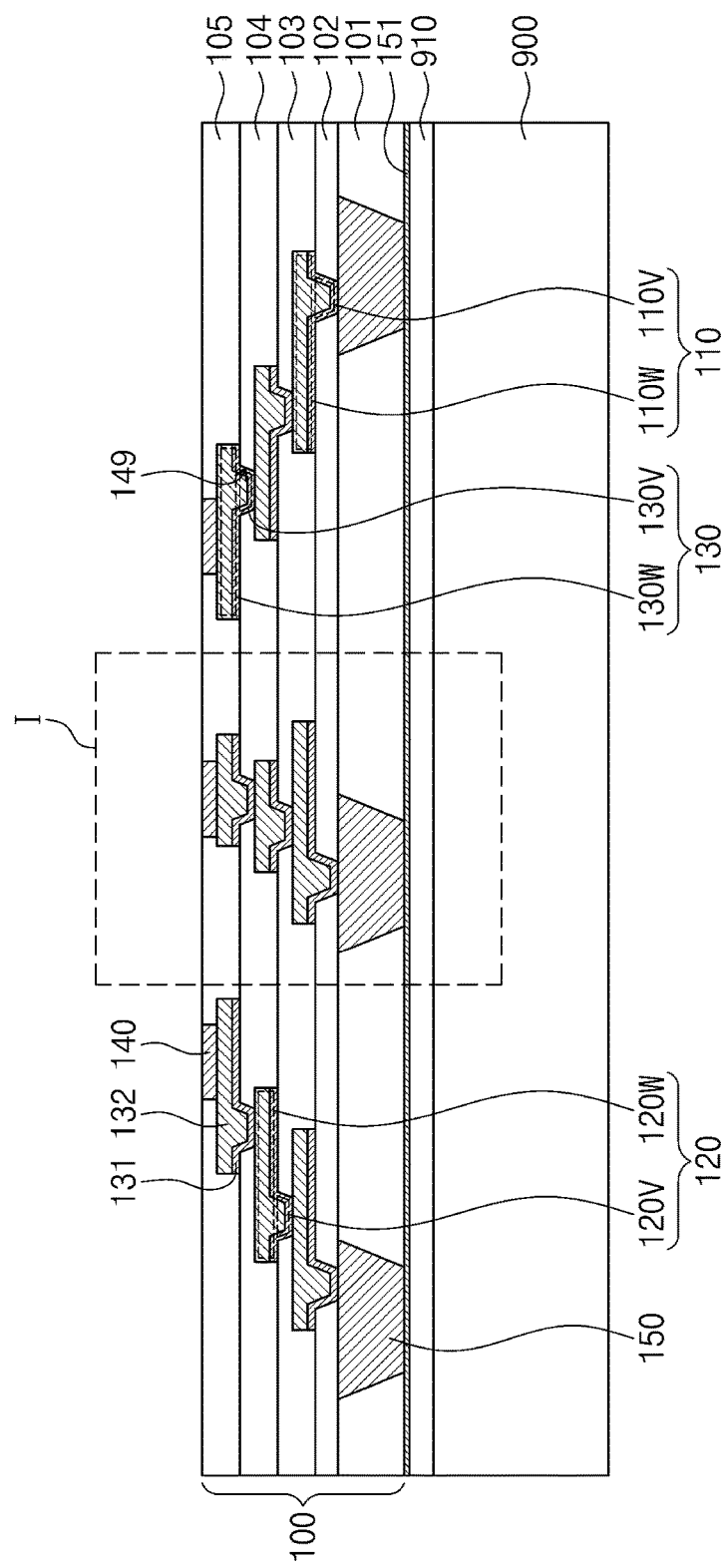
Figure 1N:
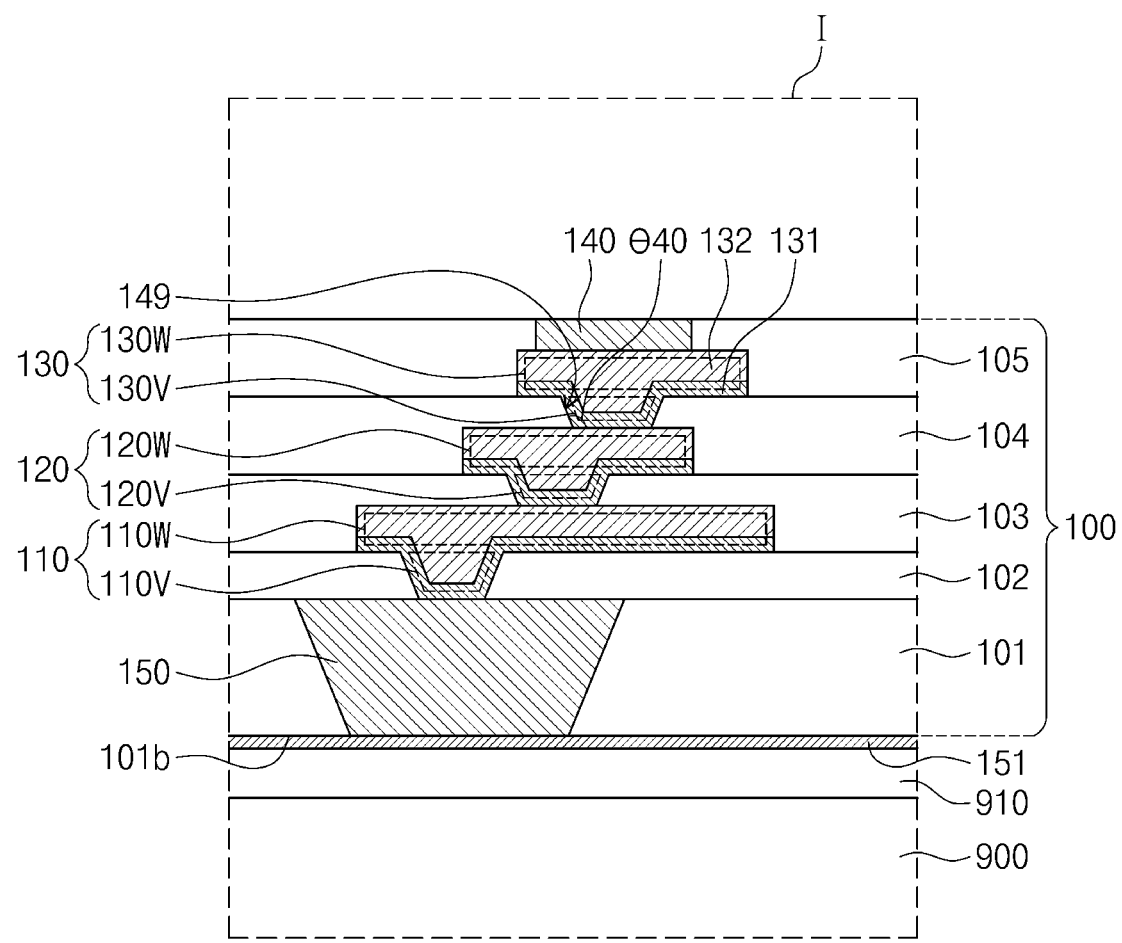
FIG. 1N illustrates an enlarged view showing section I of FIG. 1M.
Figure 10:
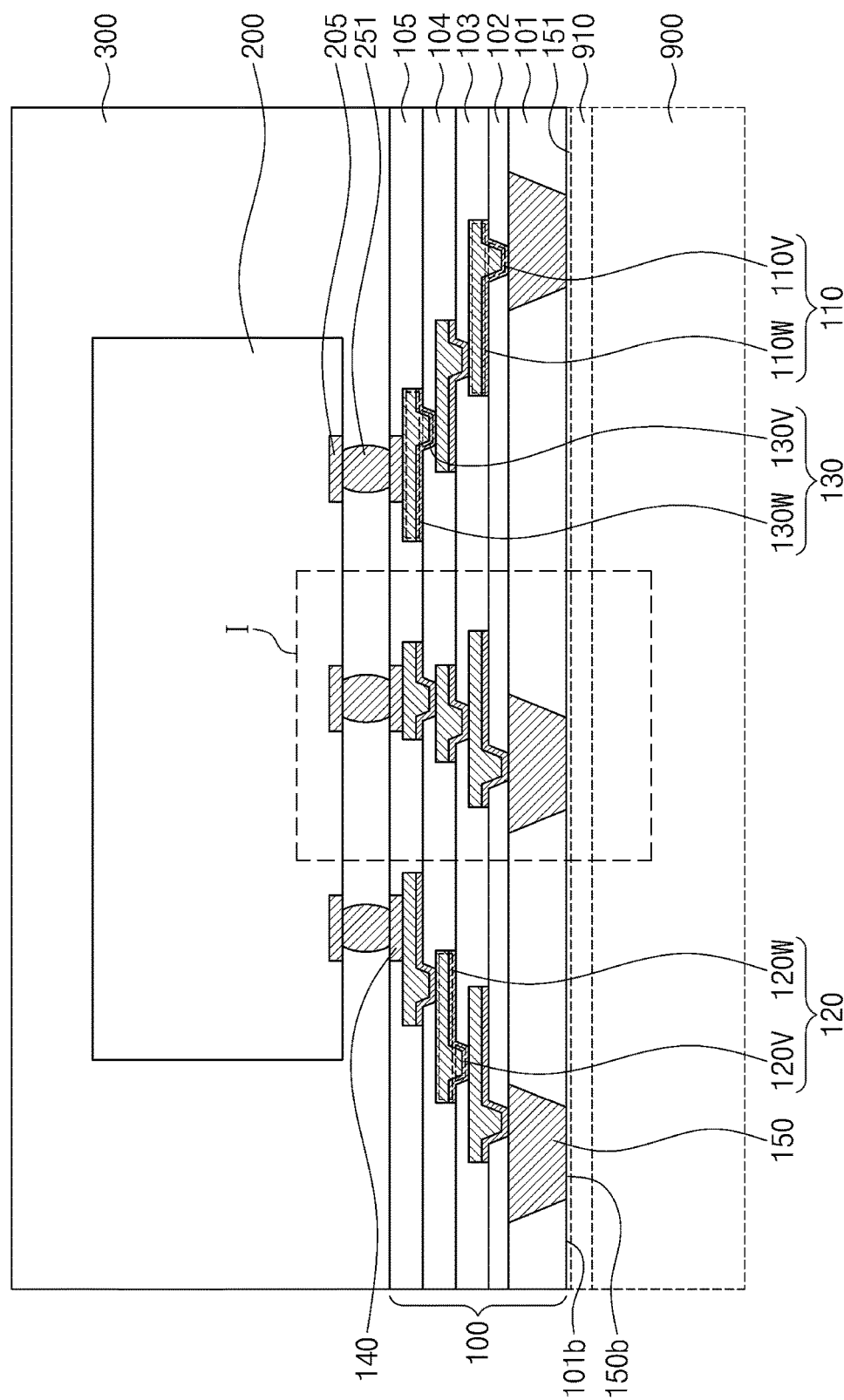
Figure 1P:
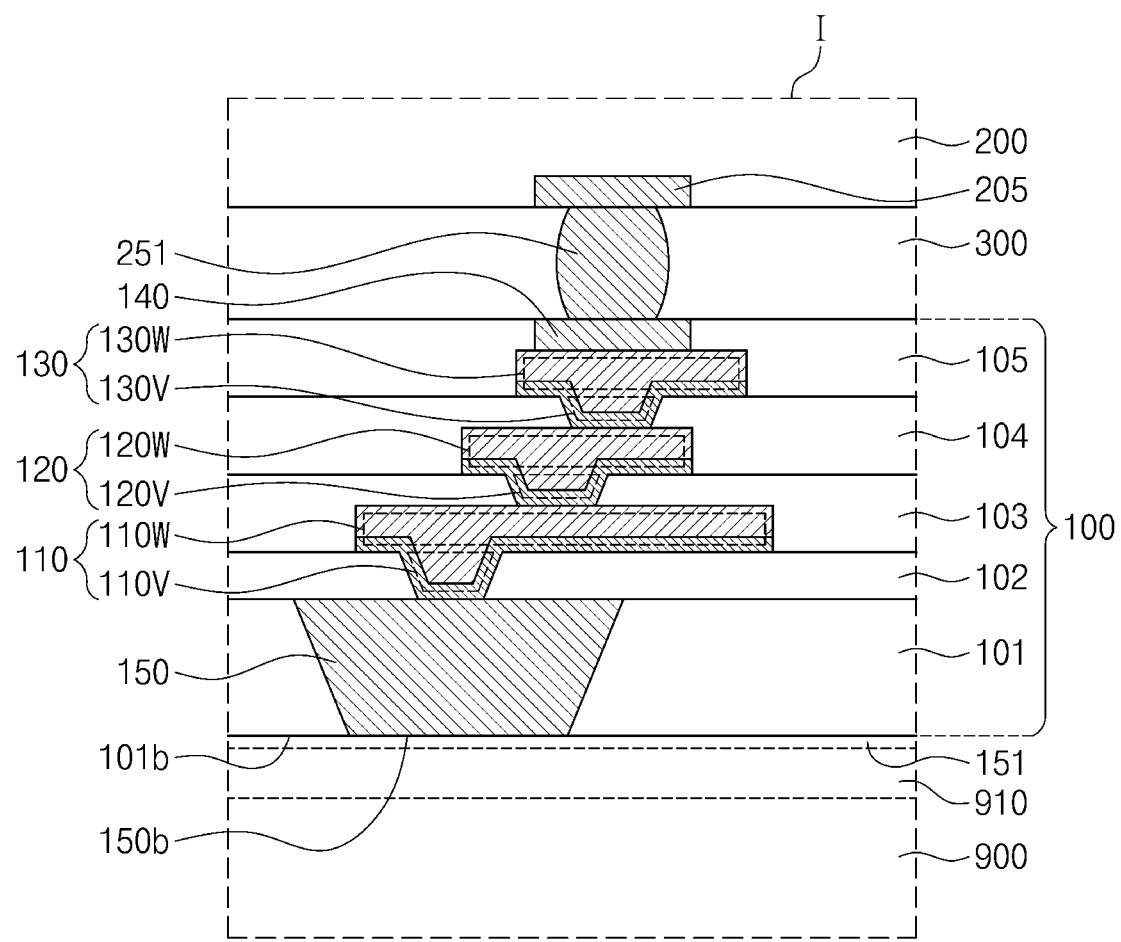
FIG. 1P illustrates an enlarged view showing section I of FIG. 1O.
Figure 1Q:
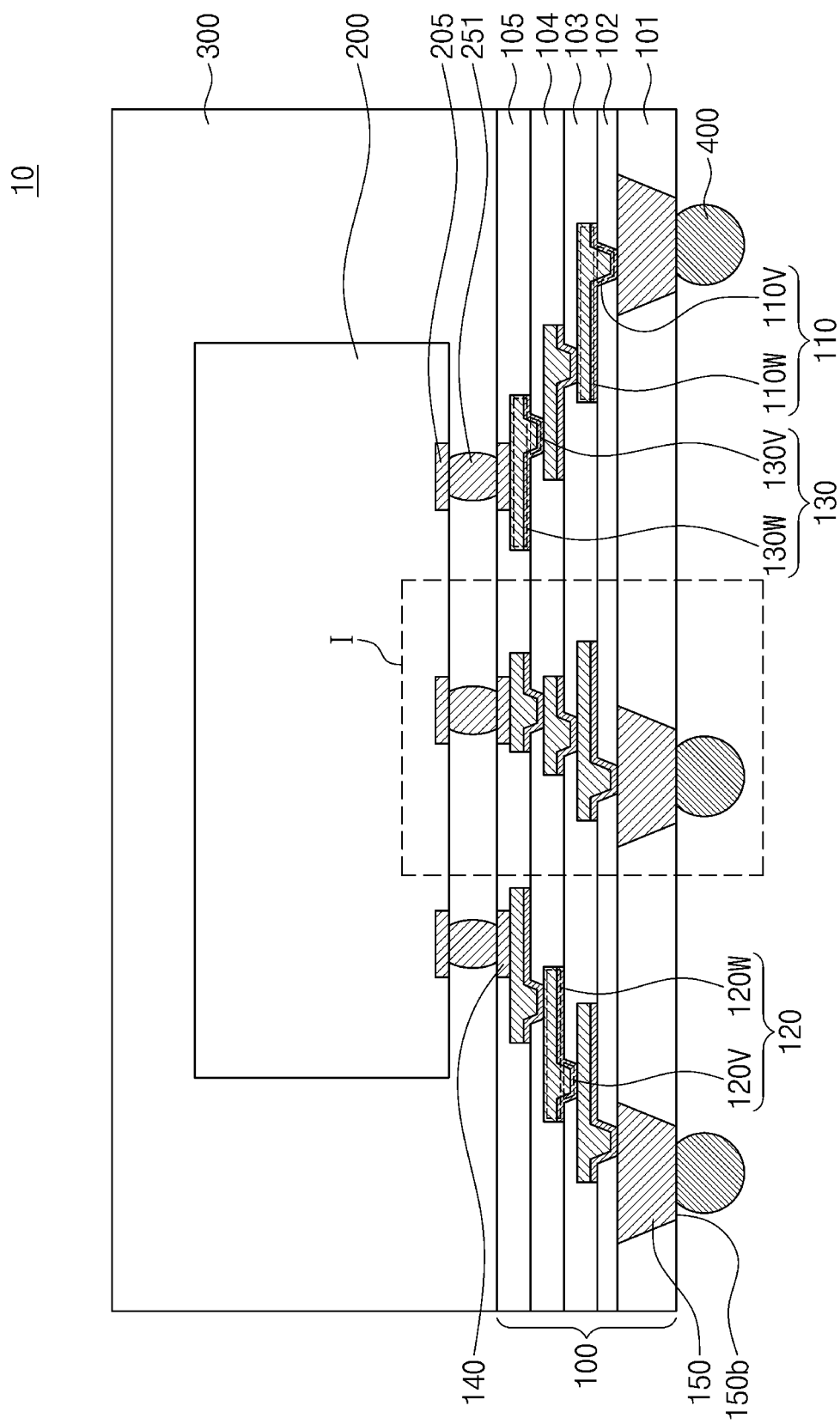
Figure 1R:
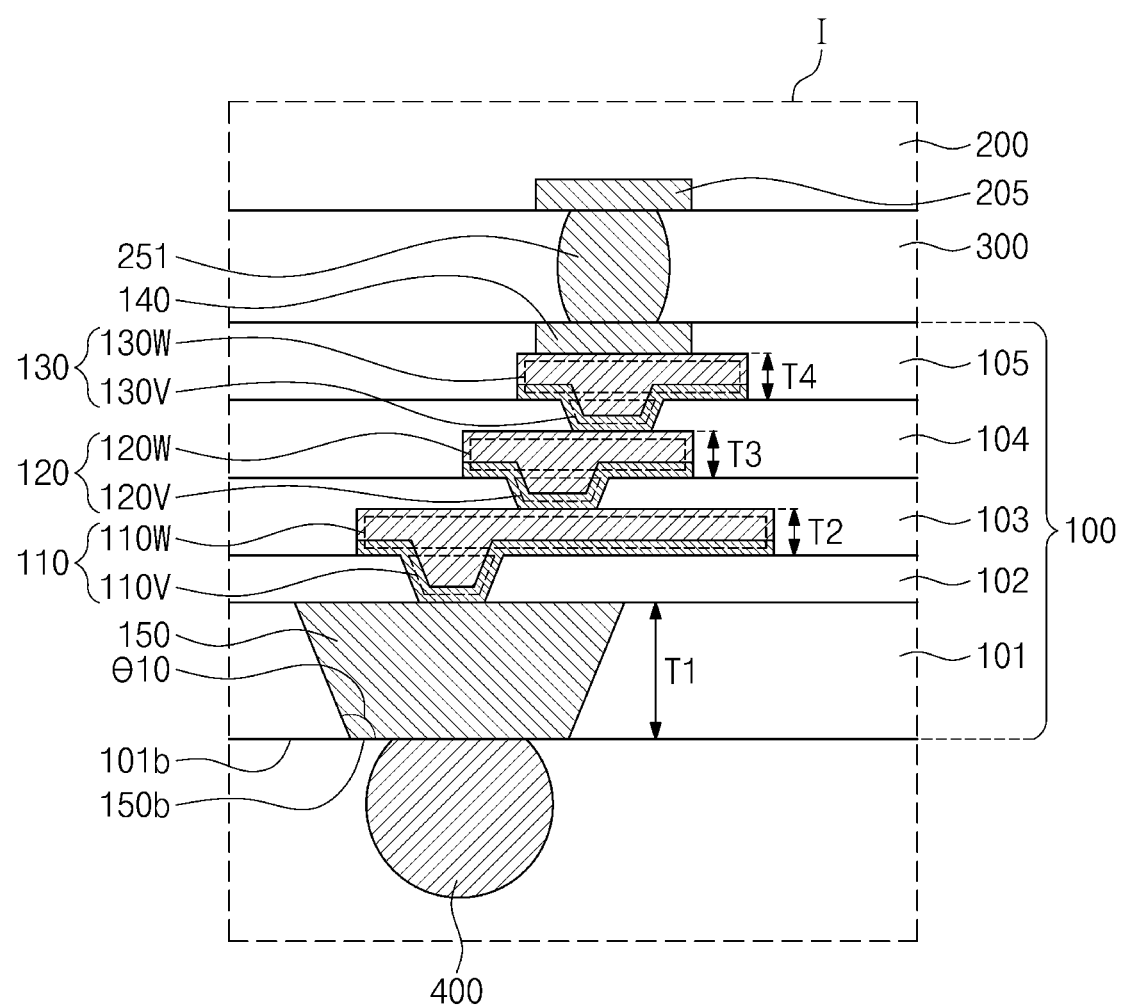
FIG. 1R illustrates an enlarged view showing section I of FIG. 1Q.
Figure 1S:
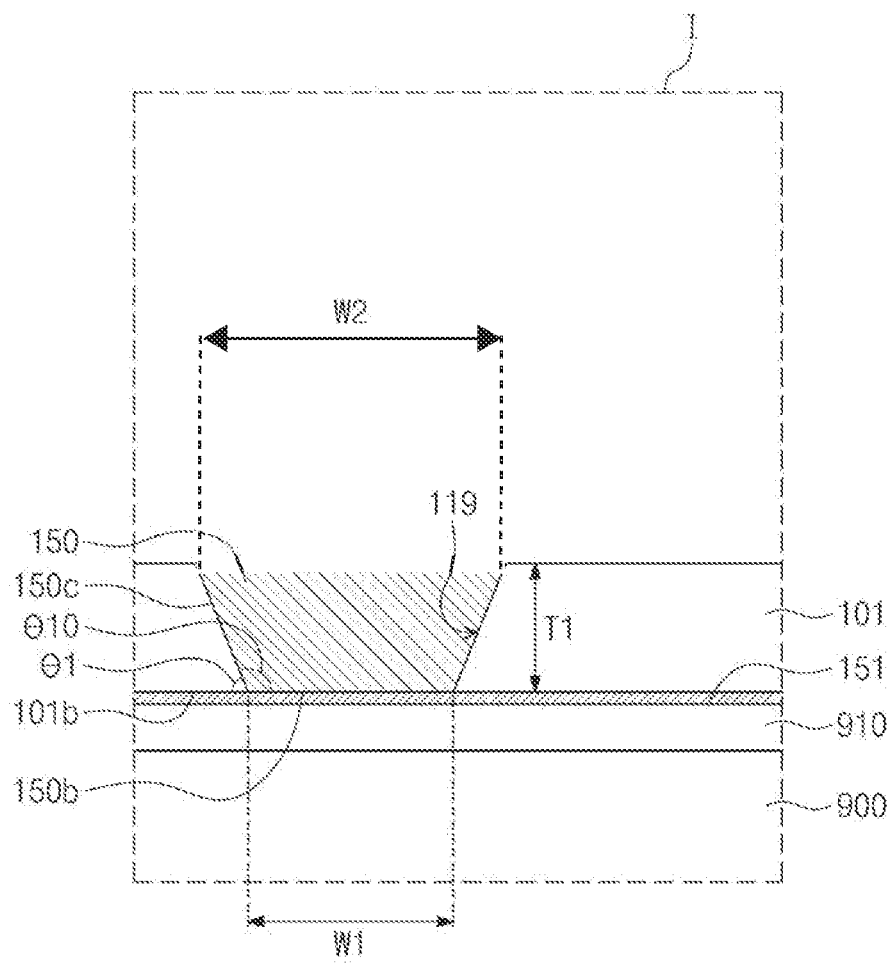
FIG. 1S illustrates an enlarged view showing section I of FIG. 1E.

Referring to FIGS. 1E, 1F, and 1S, an under-bump pattern 150 may be formed in the first opening 119. The under-bump pattern 150 may be formed by performing an electroplating process in which the lower seed layer 151 is used as an electrode. The first dielectric layer 101 may cause the under-bump pattern 150 to locally form in the first opening 119. The electroplating process may continue until a top surface of the under-bump pattern 150 has a level the same as or less than that of a top surface of the first dielectric layer 101. For example, FIG. 1F illustrates an embodiment in which a top surface of the under-bump pattern 150 is at a vertical level the same as that of the top surface of the first dielectric layer 101, and FIG. 1S illustrates an embodiment in which the top surface of the under-bump pattern 150 is at a vertical level less than that of the top surface of the first dielectric layer 101. A difference in level between the top surface of the under-bump pattern 150 and the first dielectric layer 101 may be less than a thickness T1 of the under-bump pattern 150. As shown in FIG. 1F and FIG. 1S, the first dielectric layer 101 may cover a sidewall 150c of the under-bump pattern 150, but may not cover the top surface of the under-bump pattern 150 or a bottom surface 150b of the under-bump pattern 150. A separate seed layer may not be provided between the under-bump pattern 150 and the first dielectric layer 101. The first dielectric layer 101 may physically contact the sidewall 150c of the under-bump pattern 150.

The under-bump pattern 50 may have a shape that corresponds to that of the first opening 119. A width W2 at the top surface of the under-bump pattern 150 may be greater than a width W1 at the bottom surface 150b of the under-bump pattern 150. An obtuse angle θ10 may be created between the bottom surface 150b and the sidewall 150c of the under-bump pattern 150. For example, the under-bump pattern 150 may have an angle θ10 ranging from about 105° to about 135° between the bottom surface 150b and the sidewall 150c. When the under-bump pattern 150 is formed in an opening that is defined by a resist pattern, the under-bump pattern 150 may have an angle θ1 of about 90° between the bottom surface 150b and the sidewall 150c. In this case, after the formation of the under-bump pattern 150, a removal process may be additionally performed to remove the resist pattern. According to some embodiments, because the under-bump pattern 150 is formed in the first opening 119 that is defined by the first dielectric layer 101, it may be possible to skip the formation and removal of the resist pattern. As a result, semiconductor package fabrication may be simplified.

The under-bump pattern 150 may be a conductive terminal pad. The conductive terminal pad may include a solder pad or a pillar pad. The under-bump pattern 150 may include metal. For example, the under-bump pattern 150 may include copper. The under-bump pattern 150 may not include, for example, titanium.

Referring to FIG. 1G, a second dielectric layer 102 may be formed on the top surface of the first dielectric layer 101, and may cover the top surface of the first dielectric layer 101 and the top surface of the under-bump pattern 150. The second dielectric layer 102 may contact the top surface of the first dielectric layer 101 and the top surface of the under-bump pattern 150. The second dielectric layer 102 may include a photosensitive polymer. For example, the second dielectric layer 102 may include the same material as that of the first dielectric layer 101. The first dielectric layer 101 and the second dielectric layer 102 may be called a lower dielectric layer.

The second dielectric layer 102 may be patterned to form a second preliminary opening (not shown) in the second dielectric layer 102. The second preliminary opening may have an inner wall that is substantially perpendicular to a bottom surface of the second dielectric layer 102. The second dielectric layer 102 may undergo a curing process to form a second opening 129. The curing process of the second dielectric layer 102 may include a thermal curing process. During the curing process, a portion of the second dielectric layer 102 may flow. Therefore, the second opening 129 may have a tapered shape. For example, the second dielectric layer 102 may have an angle θ2 ranging from about 45° to about 75° between an inner wall and the bottom surface thereof. The inner wall of the second dielectric layer 102 may correspond to a sidewall of the second opening 129. The second opening 129 may be formed above the under-bump pattern 150, exposing a top surface of the under-bump pattern 150.

Referring to FIG. 1H, a first seed layer 111 may be formed in the second opening 129 and on a top surface of the second dielectric layer 102. The first seed layer 111 may conformally cover the top surface and the inner wall of the second dielectric layer 102, and also conformally cover the top surface of the under-bump pattern 150 exposed to the second opening 129. The first seed layer 111 may include a conductive material. For example, the first seed layer 111 may include one or more of copper, titanium, and an alloy thereof.

A first conductive layer 112 may be formed on the first seed layer 111. The first conductive layer 112 may fill the second opening 129, and may extend onto the top surface of the second dielectric layer 102. The first conductive layer 112 may be formed by performing an electroplating process in which the first seed layer 111 is used as an electrode. The first conductive layer 112 may include metal, such as copper.

Referring to FIGS. 1I and 1J, the first conductive layer 112 and the first seed layer 111 may be patterned to form first redistribution patterns 110. The first conductive layer 112 and the first seed layer 111 may be patterned by an etching process that uses a mask layer (not shown). Each of the first redistribution patterns 110 may include the patterned first seed layer 111 and the patterned first conductive layer 112. The first redistribution patterns 110 may be spaced apart and electrically separated from each other.

Each of the first redistribution patterns 110 may include a first via part 110V and a first line part 110W. As shown in FIG. 1J, the first via part 110V may be provided in the second opening 129. The first via part 110V may have a shape that corresponds to that of the second opening 129. The first via part 110V may have an angle θ20 ranging from about 105° to about 135° between a bottom surface 110b and a sidewall 110c thereof.

The first line part 110W may be provided on the first via part 110V and the top surface of the second dielectric layer 102, and may be connected to the first via part 110V. The first line part 110W may extend lengthwise and horizontally. In this description, the term "horizontally" may mean "parallel to the bottom surface 101b of the first dielectric layer 101." The thickness T1 of the under-bump pattern 150 may be greater than a thickness T2 of the first line part 110W. The thickness T1 of the under-bump pattern 150 may be about 2.5 to 10 times the thickness T2 of the first line part 110W. The thickness T1 of the under-bump pattern 150 and the thickness T2 of the first line part 110W may be measured in a direction perpendicular to the top surface of the substrate or the bottom surface 101b of the first dielectric layer 101.

The first via part 110V may be interposed between the under-bump pattern 150 and the first line part 110W. The first via part 110V may contact the top surface of the under-bump pattern 150. The first via part 110V may have a width less than that of the under-bump pattern 150. The first via part 110V may have a minimum width W3 less than the width W1 at the bottom surface 150b of the under-bump pattern 150 and less than the width W2 at the top surface of the under-bump pattern 150. For example, the first via part 110V may have a maximum width less than the width W1 at the bottom surface 150b of the under-bump pattern 150 and less than the width W2 at the top surface of the under-bump pattern 150. The width W1 at the bottom surface 150b of the under-bump pattern 150 may correspond to a minimum width of the under-bump pattern 150, and the width W2 at the top surface of the under-bump pattern 150 may correspond to a maximum width of the under-bump pattern 150, but the present inventive concepts are not limited thereto.

When the under-bump pattern 150 is formed in an opening that is defined by a resist pattern, after the formation of the under-bump pattern 150 and the removal of the resist pattern, the formation of the first dielectric layer 101 may be performed. The first dielectric layer 101 may be formed on the top surface of the lower seed layer 151 and the top surface of the under-bump pattern 150. Therefore, the first dielectric layer 101 may have an undulation on the top surface thereof. For example, a difference in level between uppermost and lowermost portions of the top surface of the first dielectric layer 101 may be the same as or similar to the thickness T1 of the under-bump pattern 150. Thus, the first line parts 110W may have their bottom surfaces 110a at different levels from each other.

According to some embodiments, the formation of a resist pattern may be skipped as discussed in FIGS. 1A to 1F, and before the formation of the under-bump pattern 150, the first dielectric layer 101 may be formed on the release layer 910. The top surface of the first dielectric layer 101 may be substantially flat. A difference in level between the top surface of the under-bump pattern 150 and the top surface of the first dielectric layer 101 may be much less than the thickness T1 of the under-bump pattern 150. The second dielectric layer 102 may be formed on the first dielectric layer 101 and the under-bump pattern 150, and the top surface of the second dielectric layer 102 may be substantially flat. As shown in FIG. 1I, because the first redistribution patterns 110 are formed on the top surface of the second dielectric layer 102, the bottom surfaces 110a of the first line parts 110W may be located at the same level or similar levels. For example, a maximum interval between the bottom surface 101b of the first dielectric layer 101 and the bottom surfaces 110a of the first line parts 110W may be 100% to 130% of a minimum interval between the bottom surface 101b of the first dielectric layer 101 and the bottom surfaces 110a of the first line parts 110W. In this case, the bottom surfaces 110a of the first line parts 110W may be defined to refer to surfaces that physically contact the second dielectric layer 102.

Referring to FIGS. 1K and 1L, a third dielectric layer 103 may be formed on the second dielectric layer 102, and may cover the second dielectric layer 102 and the first redistribution pattern 110. The third dielectric layer 103 may contact a top surface of the second dielectric layer 102 and top and side surfaces of the first redistribution patterns 110. The third dielectric layer 103 may include a photosensitive polymer. A third opening 139 may be formed in the third dielectric layer 103. The third opening 139 may expose a top surface of the first redistribution pattern 110. The formation of the third opening 139 may include patterning the third dielectric layer 103 to form a third preliminary opening and performing a curing process on the third dielectric layer 103. An inner wall of the third dielectric layer 103 may correspond to a sidewall of the third opening 139. The patterning of the third dielectric layer 103 may be performed by the same method as that used to pattern the first dielectric layer 101 discussed in FIGS. 1A and 1B. The curing process of the third dielectric layer 103 may be performed by the same method as that used to cure the first dielectric layer 101 discussed in FIGS. 1C and 1D. The third opening 139 may have a tapered shape.

A second redistribution pattern 120 may be formed on a top surface of the third dielectric layer 103 and in the third opening 139, and may be electrically connected to the first redistribution pattern 110. According to some embodiments, a second seed layer 121 may be conformally formed on a sidewall and a bottom surface of the third opening 139 and also on the top surface of the third dielectric layer 103. The second seed layer 121 may include a conductive material, such as copper, titanium, or an alloy thereof. An electroplating process may be performed to form a second conductive layer 122 on the second seed layer 121. The second conductive layer 122 may fill the third opening 139 and may extend onto the top surface of the third dielectric layer 103. The second conductive layer 122 may include metal, such as copper. The second conductive layer 122 and the second seed layer 121 may be patterned by an etching process to form second redistribution patterns 120. Each of the second redistribution patterns 120 may include the patterned second seed layer 121 and the patterned second conductive layer 122. The second redistribution patterns 120 may be spaced apart from each other. Each of the second redistribution patterns 120 may extend lengthwise in the horizontal direction.

Each of the second redistribution patterns 120 may include a second via part 120V and a second line part 120W. As shown in FIG. 1L, the second via part 120V may be provided in the third opening 139. The second redistribution pattern 120 may have an angle θ30 ranging from about 105° to about 135° between a bottom surface and a sidewall of the second via part 120V. The second line part 120W may be provided on the second via part 120V and the top surface of the third dielectric layer 103, and may be connected to the second via part 120V.

Referring to FIGS. 1M and 1N, a fourth dielectric layer 104 may be formed on the third dielectric layer 103, and may cover the third dielectric layer 103 and the second redistribution pattern 120. The fourth dielectric layer 104 may contact a top surface of the third dielectric layer 103 and top and side surfaces of the second redistribution patterns 120. The fourth dielectric layer 104 may include a photosensitive polymer. A fourth opening 149 may be formed in the fourth dielectric layer 104. The fourth opening 149 may expose a top surface of the second redistribution pattern 120. The formation of the fourth opening 149 may include patterning the fourth dielectric layer 104 to form a fourth preliminary opening, and performing a curing process on the fourth dielectric layer 104. The fourth opening 149 may have a tapered shape.

A third redistribution pattern 130 may be formed on a top surface of the fourth dielectric layer 104 and in the fourth opening 149, and may be electrically connected to the second redistribution pattern 120. According to some embodiments, a third seed layer 131 may be conformally formed on a bottom surface and a sidewall of the fourth opening 149 and also on the top surface of the fourth dielectric layer 104. The third seed layer 131 may include a conductive material, such as copper or titanium. An electroplating process may be performed to form a third conductive layer 132 on the third seed layer 131. On the third seed layer 131, the third conductive layer 132 may fill the fourth opening 149. The third conductive layer 132 may extend onto the top surface of the fourth dielectric layer 104, and may cover the third seed layer 131. The third conductive layer 132 may include metal, such as copper. The third conductive layer 132 and the third seed layer 131 may be patterned to form third redistribution patterns 130. Each of the third redistribution patterns 130 may include the patterned third seed layer 131 and the patterned third conductive layer 132.

Each of the third redistribution patterns 130 may include a third via part 130V and a third line part 130W. As shown in FIG. 1N, the third via part 130V may be provided in the fourth opening 149. The third redistribution pattern 130 may have an angle θ40 ranging from about 105° to about 135° between a bottom surface and a sidewall of the third via part 130V. The third via part 130V may contact the top surface of the second redistribution pattern 120. The third line part 130W may be provided on the top surface of the fourth dielectric layer 104, and may be connected to the third via part 130V.

A fifth dielectric layer 105 may be formed on the fourth dielectric layer 104, and may cover the third redistribution pattern 130 and the top surface of the fourth dielectric layer 104. The fifth dielectric layer 105 may contact the top surface of the fourth dielectric layer 104 and top and side surfaces of the third redistribution patterns 130. The fifth dielectric layer 105 may include a photosensitive polymer.

Conductive pads 140 may be formed on the third redistribution patterns 130. Each conductive pad 140 may contact a top surface of a corresponding one of the third redistribution patterns 130. The conductive pads 140 may include metal, such as copper and/or aluminum. The conductive pads 140 may be connected to corresponding under-bump patterns 150 through the first, second, and third redistribution patterns 110, 120, and 130. At least one of the conductive pads 140 may not be vertically aligned with the under-bump pattern 150 to which the at least one conductive pad 140 is connected. The term "vertically" may mean "perpendicular to the bottom surface 101b of the first dielectric layer 101." The fifth dielectric layer 105 may expose top surfaces of the conductive pads 140. In some embodiments, a top surface of the fifth dielectric layer 105 may be coplanar with top surfaces of the conductive pads 140. Differently from that shown, the conductive pads 140 may have their bottom surfaces on a top surface of the fifth dielectric layer 105.

A redistribution substrate 100 may be fabricated by the processes discussed above. The redistribution substrate 100 may be a redistribution layer. The redistribution substrate 100 may include the under-bump pattern 150; the first, second, third, fourth, and fifth dielectric layers 101, 102, 103, 104, and 105; the first, second, and third redistribution patterns 110, 120, and 130; and the conductive pads 140. The number of the dielectric layers 101, 102, 103, 104, and 105 and the number of the redistribution patterns 110, 120, and 130 are not limited to that shown, but may be variously changed. One or more of the third, fourth, and fifth dielectric layers 103, 104, and 105 may be called an upper dielectric layer.

Referring to FIGS. 1O and 1P, the redistribution substrate 100 may be provided thereon with a semiconductor chip 200 whose chip pads 205 face the redistribution substrate 100. First connectors 251 may be formed between and electrically connected to corresponding conductive pads 140 and corresponding chip pads 205. Each of the first connectors 251 may include one or more of a solder ball, a pillar, and a bump. The first connectors 251 may include a conductive material, such as metal. For example, the first connectors 251 may include a solder material. The semiconductor chip 200 may be electrically connected through the first connectors 251 to the redistribution substrate 100. In this description, the phrase "electrically connected to the redistribution substrate 100" may mean that "electrically connected to one or more of the first, second, and third redistribution patterns 110, 120, and 130." The phrase "coupled to the chip pad 205" may mean that "coupled to the semiconductor chip 200" or "coupled to integrated circuits in the semiconductor chip 200."

As shown in FIG. 1O, a molding layer 300 may be formed on the redistribution substrate 100, and may cover the semiconductor chip 200. The molding layer 300 may cover an uppermost one of the dielectric layers 101, 102, 103, 104, and 105. The uppermost dielectric layer may be the fifth dielectric layer 105. The molding layer 300 may further extend toward a gap between the semiconductor chip 200 and the redistribution substrate 100, and may encapsulate the first connectors 251. The molding layer 300 may include a dielectric polymer, such as an epoxy molding compound. For example, an under-fill layer (not shown) may further be formed in the gap between the redistribution substrate 100 and the semiconductor chip 200. Afterwards, the carrier substrate 900 and the release layer 910 may be removed to expose the lower seed layer 151.

As shown in FIG. 1P, the lower seed layer 151 may be removed to expose the bottom surface 101b of the first dielectric layer 101 and the bottom surface 150b of the under-bump pattern 150. The removal of the lower seed layer 151 may be performed by, for example, an etching process. The first dielectric layer 101 may expose the bottom surface 150b of the under-bump pattern 150. The bottom surface 150b of the under-bump pattern 150 may be coplanar with the bottom surface 101b of the first dielectric layer 101. For example, the bottom surface 150b of the under-bump pattern 150 may be located at substantially the same level as that of the bottom surface 101b of the first dielectric layer 101.

Referring to FIGS. 1Q and 1R, an external terminal 400 may be formed on a bottom surface of the redistribution substrate 100. The external terminal 400 may be disposed on the exposed bottom surface 150b of the under-bump pattern 150, and may be electrically connected to the under-bump pattern 150. The external terminal 400 may be coupled to at least one of the chip pads 205 through the under-bump pattern 150 and the redistribution patterns 110, 120, and 130. The external terminal 400 may not be vertically aligned with the at least one chip pad 205. As shown in FIG. 1Q, the external terminal 400 may be provided in plural, and when viewed in plan, at least one of the plurality of external terminals 400 may overlap the molding layer 300. Each of the external terminals 400 may include one or more of a solder ball, a bump, and a pillar. The external terminals 400 may include a solder material. The solder material may include, for example, tin, bismuth, lead, silver, or an alloy thereof.

When the thickness T1 of the under-bump pattern 150 is less than 2.5 times the thickness T2 of the first line parts 110W of the first redistribution patterns 110, the thickness T1 of the under-bump pattern 150 may become dramatically reduced when the semiconductor package 10 operates continuously. When the thickness T1 of the under-bump pattern 150 is greater than 10 times the thickness T2 of the first line parts 110W, the redistribution substrate 100 may be difficult to have a compact-size. According to some embodiments, the thickness T1 of the under-bump pattern 150 may be about 2.5 to 10 times the thickness T2 of the first line parts 110W of the first redistribution patterns 110. Therefore, even though the semiconductor package 10 operates continuously, the thickness T1 of the under-bump pattern 150 may satisfy a required range. As a result, the redistribution substrate 100 may increase in durability and reliability. The redistribution substrate 100 may become compact-sized. The thickness T1 of the under-bump pattern 150 may be greater than a thickness T3 of the second line parts 120W and a thickness T4 of the third line parts 130W. The thickness T1 of the under-bump pattern 150 may be about 2.5 to 10 times the thickness T3 of the second line parts 120W and about 2.5 to 10 times the thickness T4 of the third line parts 130W. The thickness T3 of the second line parts 120W and the thickness T4 of the third line parts 130W may be measured in a direction perpendicular to the top surface of the substrate or the bottom surface 101b of the first dielectric layer 101.

Through the processes discussed above, a semiconductor package 10 may be eventually fabricated. The semiconductor package 10 may be a fan-out semiconductor package.

Figure 2A:
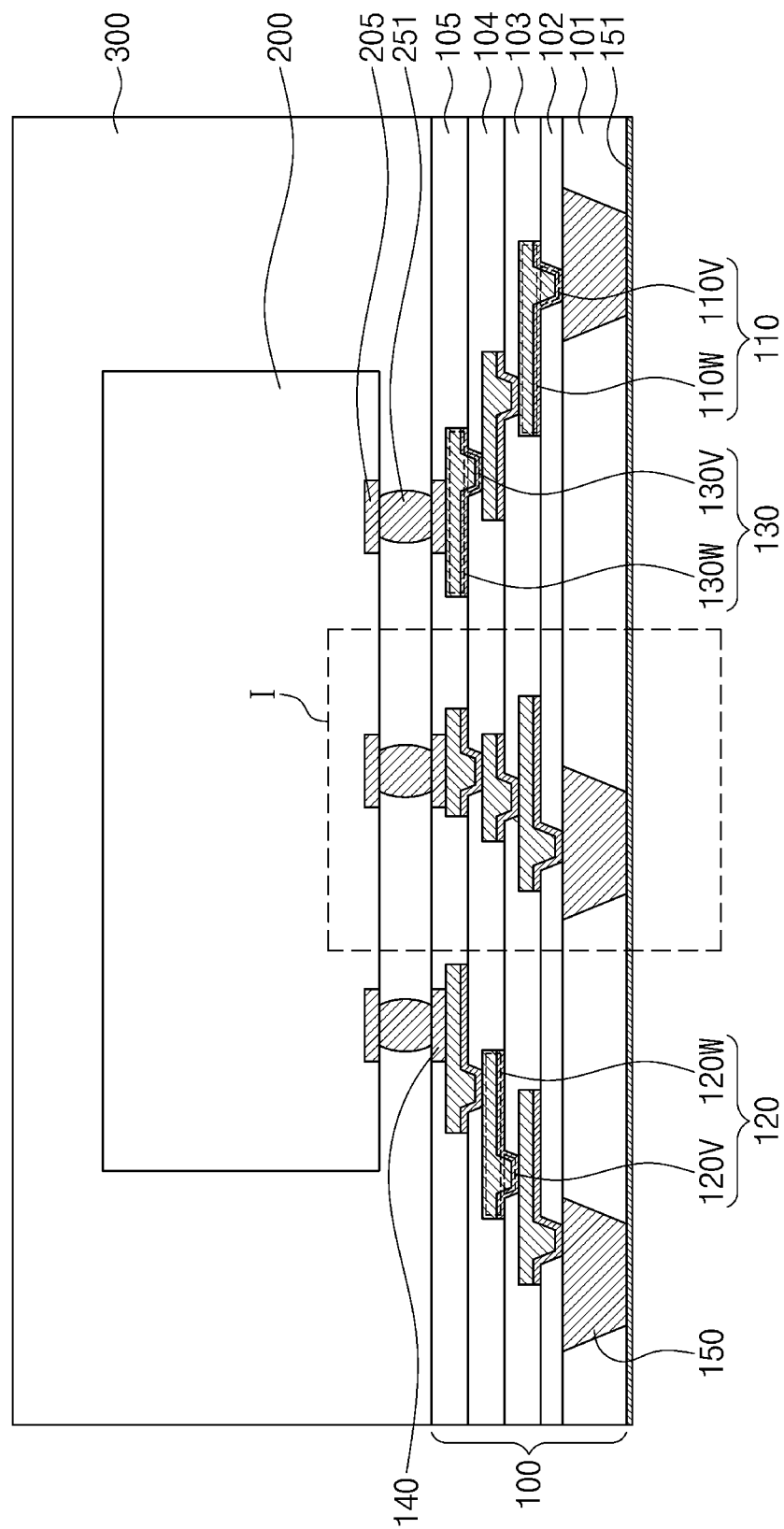
FIGS. 2A, 2C, and 2E illustrate cross-sectional views showing a method of fabricating a semiconductor package according to some exemplary embodiments.
Figure 2B:
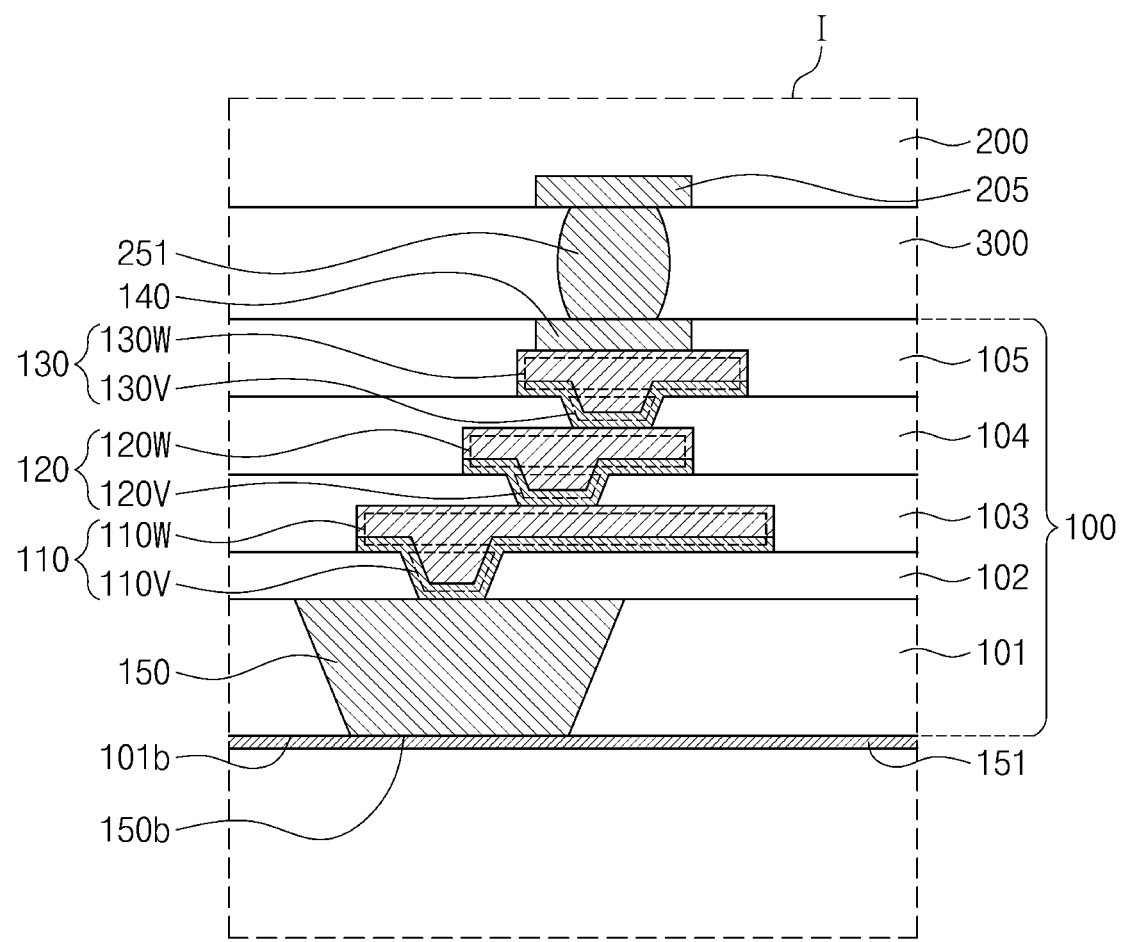
FIG. 2B illustrates an enlarged view showing section I of FIG. 2A.
Figure 2C:
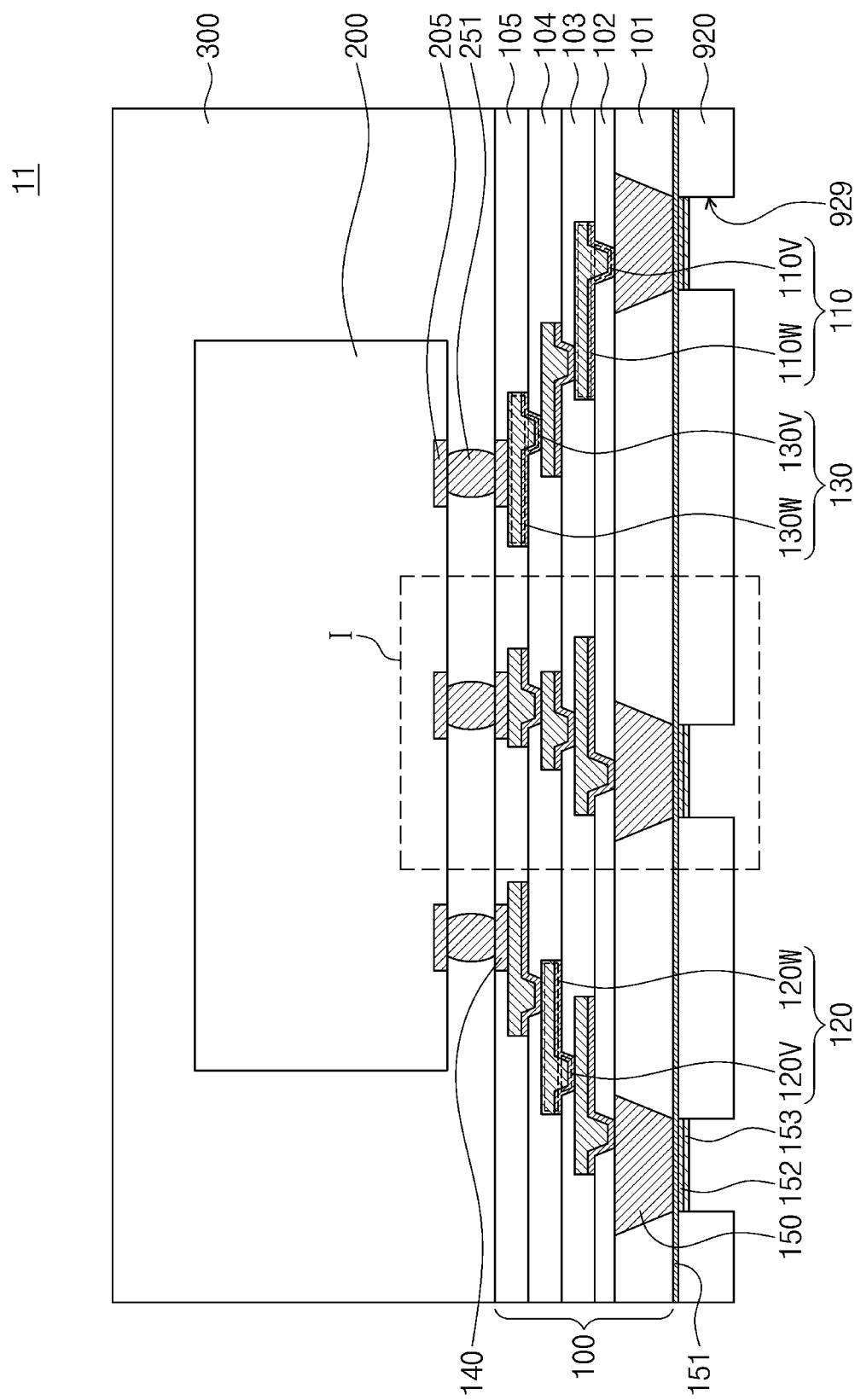
Figure 2D:
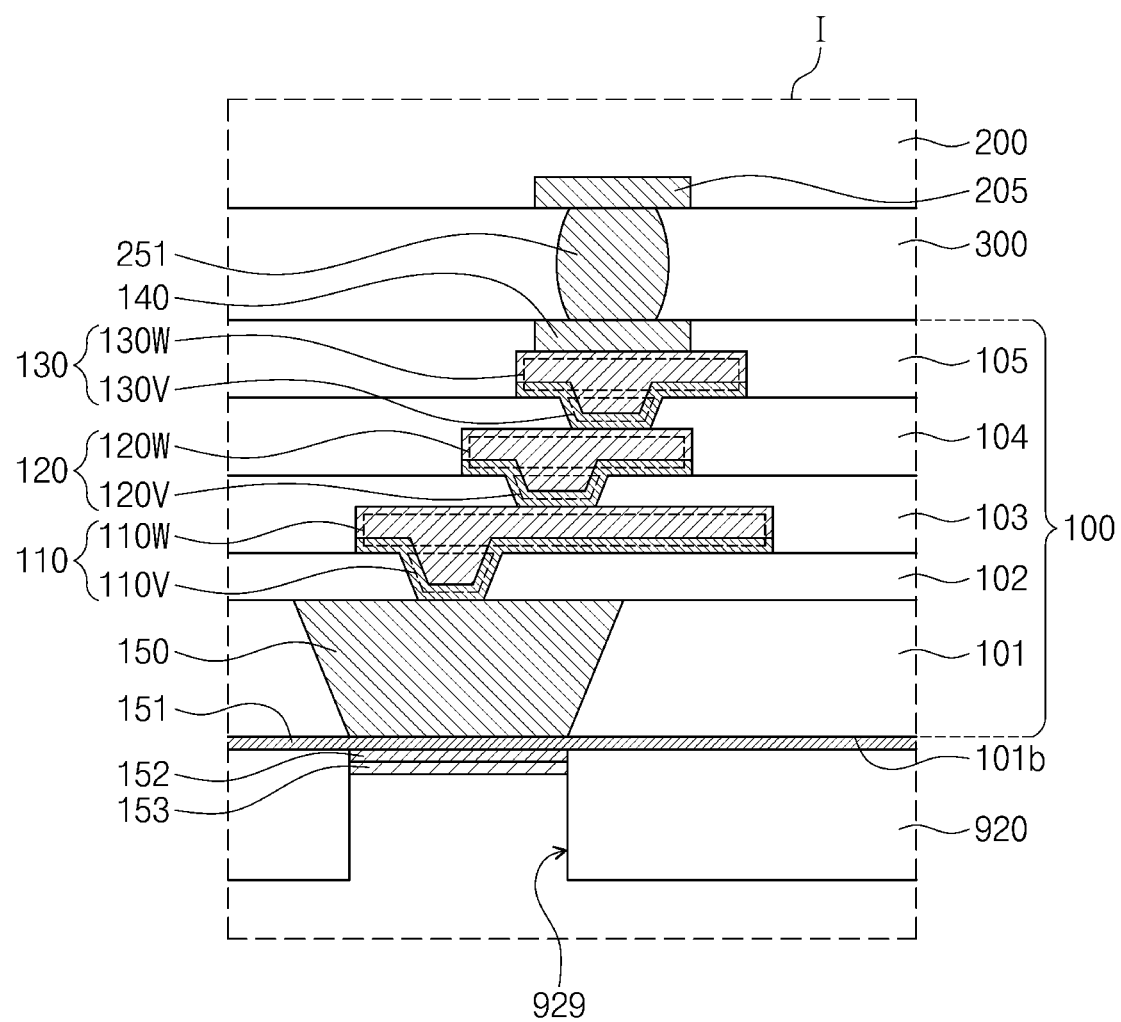
FIG. 2D illustrates an enlarged view showing section I of FIG. 2C.
Figure 2E:
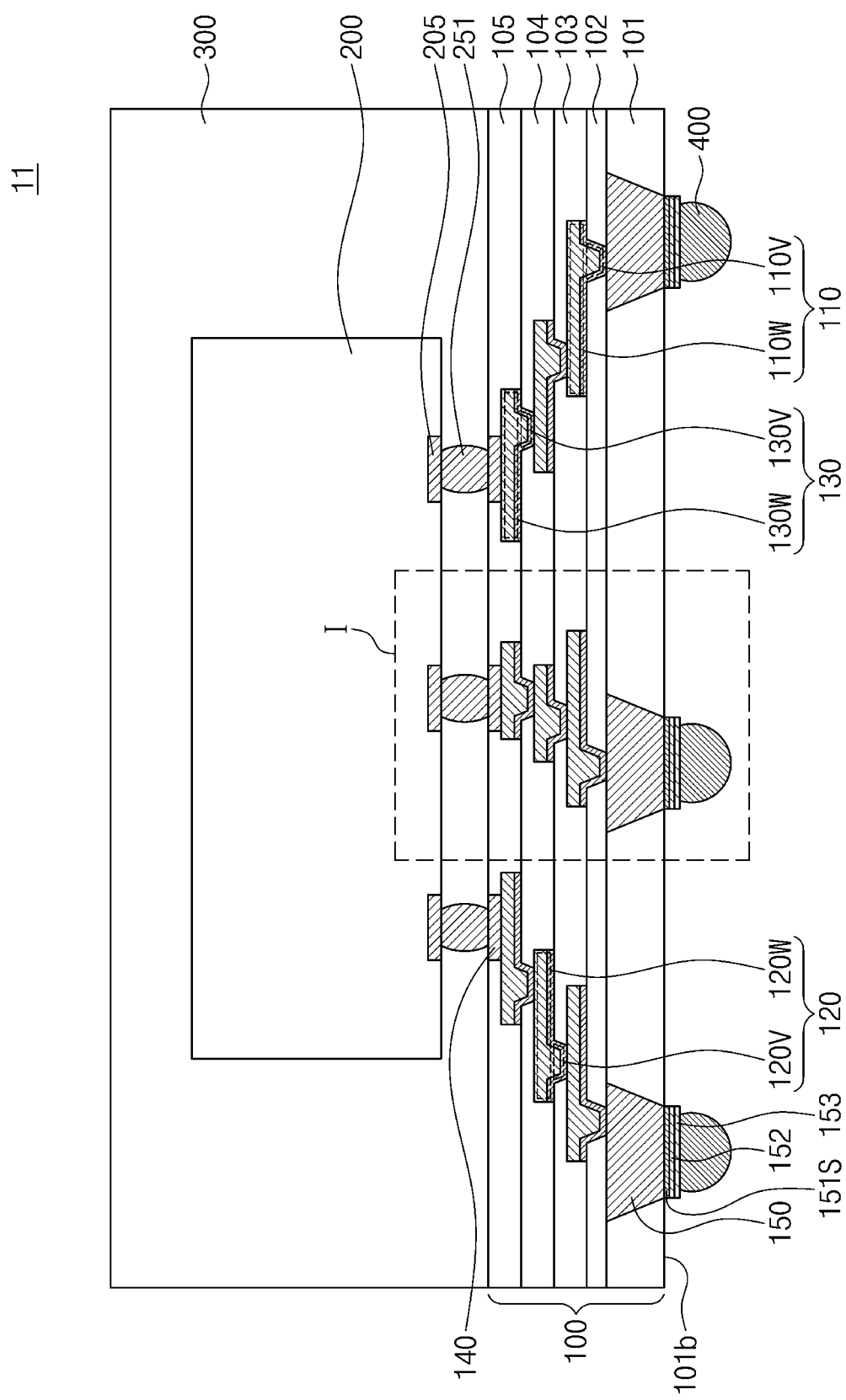
Figure 2F:
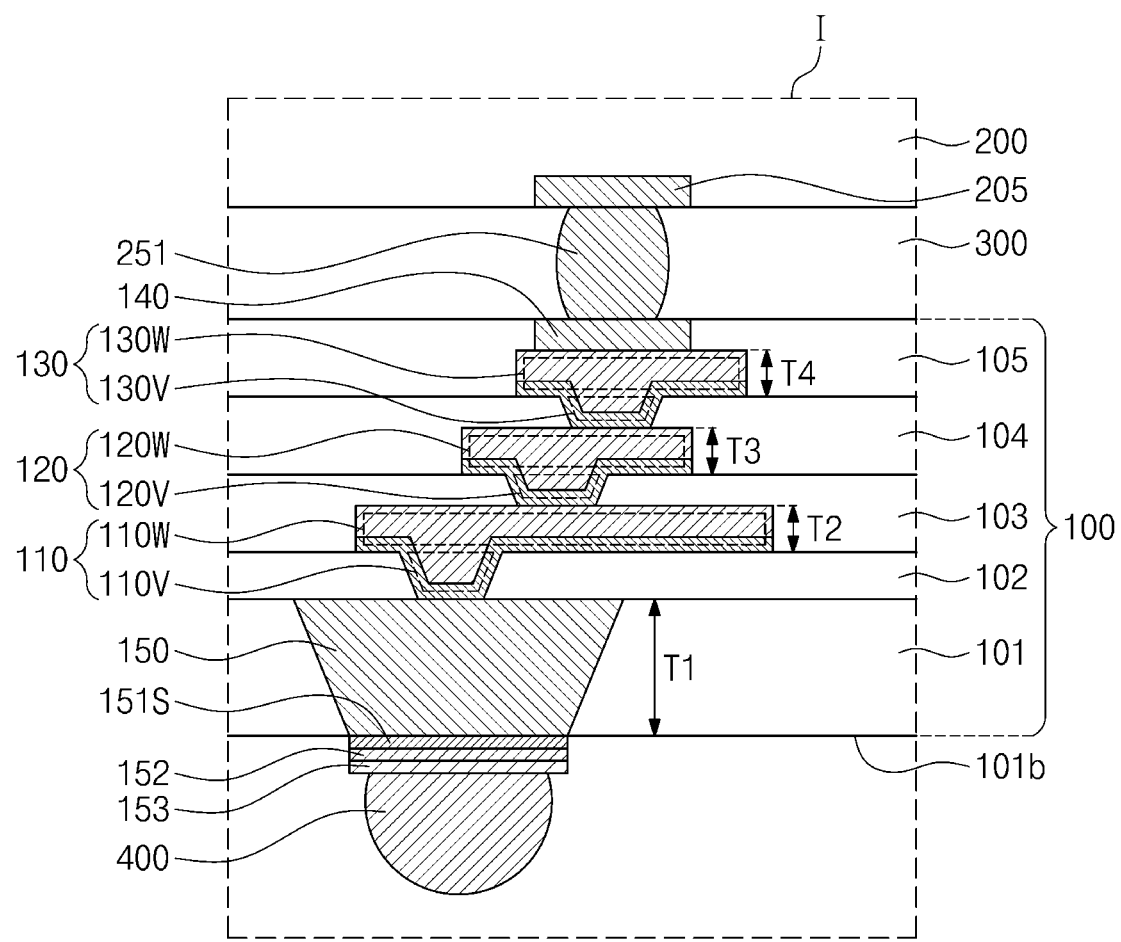
FIG. 2F illustrates an enlarged view showing section I of FIG. 2E.

FIGS. 2A, 2C, and 2E illustrate cross-sectional views showing a method of fabricating a semiconductor package according to some exemplary embodiments. FIG. 2B illustrates an enlarged view showing section I of FIG. 2A. FIG. 2D illustrates an enlarged view showing section I of FIG. 2C. FIG. 2F illustrates an enlarged view showing section I of FIG. 2E. Duplicate descriptions will be omitted below.

Referring back to FIGS. 1M and 1N, the lower seed layer 151 and the redistribution substrate 100 may be formed on the carrier substrate 900.

Referring to FIGS. 2A and 2B, the semiconductor chip 200 may be mounted on the redistribution substrate 100, and then the molding layer 300 may be formed on the redistribution substrate 100. Thereafter, the carrier substrate 900 and the release layer 910 may be removed to expose a bottom surface of the lower seed layer 151.

Referring to FIGS. 2C and 2D, a lower mask pattern 920 may be formed on the bottom surface of the lower seed layer 151. The lower mask pattern 920 may have a lower opening 929 that exposes the lower seed layer 151. The lower mask pattern 920 may be formed by coating, for example, a resist material.

A first lower under-bump pattern 152 may be formed in the lower opening 929, and may cover the bottom surface of the lower seed layer 151. The first lower under-bump pattern 152 may contact the bottom surface of the lower seed layer 151, and may completely cover the exposed bottom surface of the lower seed layer 151. The first lower under-bump pattern 152 may be formed by performing an electroplating process in which the lower seed layer 151 is used as an electrode. The first lower under-bump pattern 152 may include a different material from that of the under-bump pattern 150. The first lower under-bump pattern 152 may include nickel. The first lower under-bump pattern 152 may serve as a barrier layer to prevent the diffusion of materials (e.g., copper) included in the under-bump pattern 150.

A second lower under-bump pattern 153 may be formed in the lower opening 929, and may cover a bottom surface of the first lower under-bump pattern 152. The second lower under-bump pattern 153 may contact the bottom surface of the first lower under-bump pattern 152. The second lower under-bump pattern 153 may include a different material from that of the first lower under-bump pattern 152 and that of the under-bump pattern 150. Gold (Au) may have wetting characteristics with respect to a solder material. The second lower under-bump pattern 153 may include gold and may thus serve as a wetting layer. Each of the first and second lower under-bump patterns 152 and 153 may be localized in the lower opening 929, and may not extend onto a bottom surface of the lower mask pattern 920. Afterwards, the lower mask pattern 920 may be removed to expose the bottom surface of the lower seed layer 151.

Referring to FIGS. 2E and 2F, the lower seed layer 151 may be patterned to form seed patterns 151S. The patterning of the lower seed layer 151 may include performing an etching process on the exposed lower seed layer 151. The etching process may continue until the bottom surface 101b of the first dielectric layer 101 is exposed. The seed patterns 151S may be electrically separated from each other. The width of each seed pattern 151S may be the same as the width W1 at the bottom surface 150b of the under-bump pattern 150. Each seed pattern 151S may have a sidewall aligned with that of the first lower under-bump pattern 152 and that of the second lower under-bump pattern 153. The widths of the first lower under-bump pattern 152 and the second lower under-bump pattern 153 may be the same as the width W1 at the bottom surface 150b of the under-bump pattern 150.

The external terminals 400 may be formed on a bottom surface of the second lower under-bump pattern 153. The second lower under-bump pattern 153 may serve as a wetting layer. For example, the second lower under-bump pattern 153 may satisfactorily attach the external terminals 400 to the first lower under-bump pattern 152.

Through the processes discussed above, a semiconductor package 11 may be eventually fabricated. The semiconductor package 11 may include a seed pattern 151S, the first lower under-bump pattern 152, and the second lower under-bump pattern 153 that are stacked. The seed pattern 151S, the first lower under-bump pattern 152, and the second lower under-bump pattern 153 may be interposed between the under-bump pattern 150 and the external terminals 400. Alternatively, one of the first and second lower under-bump patterns 152 and 153 may not be formed.

The formation of the seed pattern 151S, the first lower under-bump pattern 152, and the second lower under-bump pattern 153 is not limited to that discussed in FIGS. 2A to 2F, but may be variously changed.

In certain figures, for convenience of drawings, the first, second, and third redistribution patterns 110, 120, and 130 are illustrated without discriminating the seed layers 111, 121, and 131 from the conductive layers 112, 122, and 132. For example, the first redistribution pattern 110 is illustrated without discriminating the first seed layer 111 from the first conductive layer 112. The present inventive concepts, however, are not limited thereto.

Figure 3A:
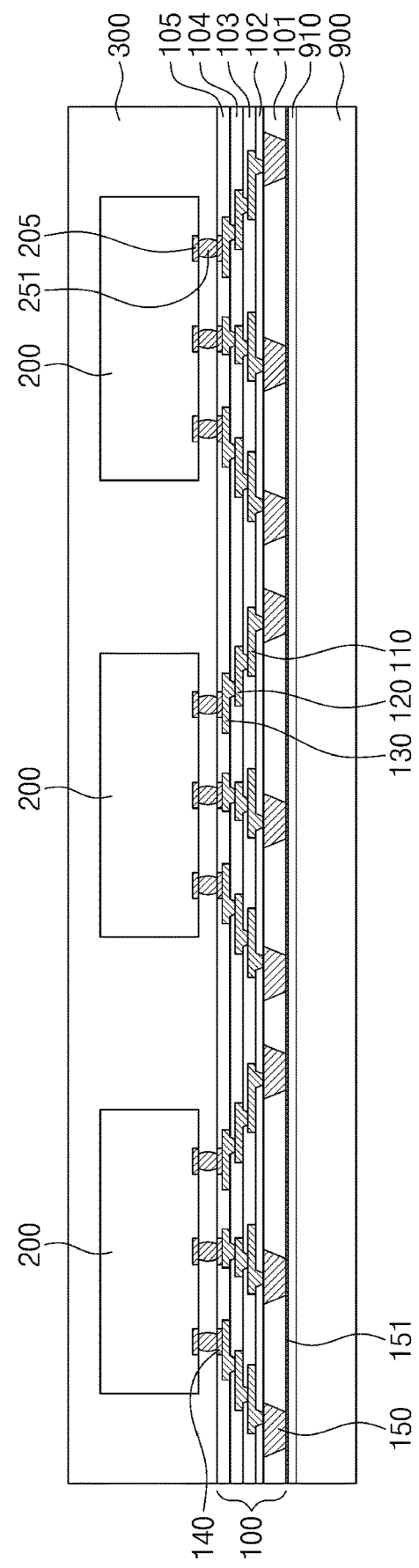
FIGS. 3A and 3B illustrate cross-sectional views showing a method of fabricating a semiconductor package according to some example embodiments.
Figure 3B:
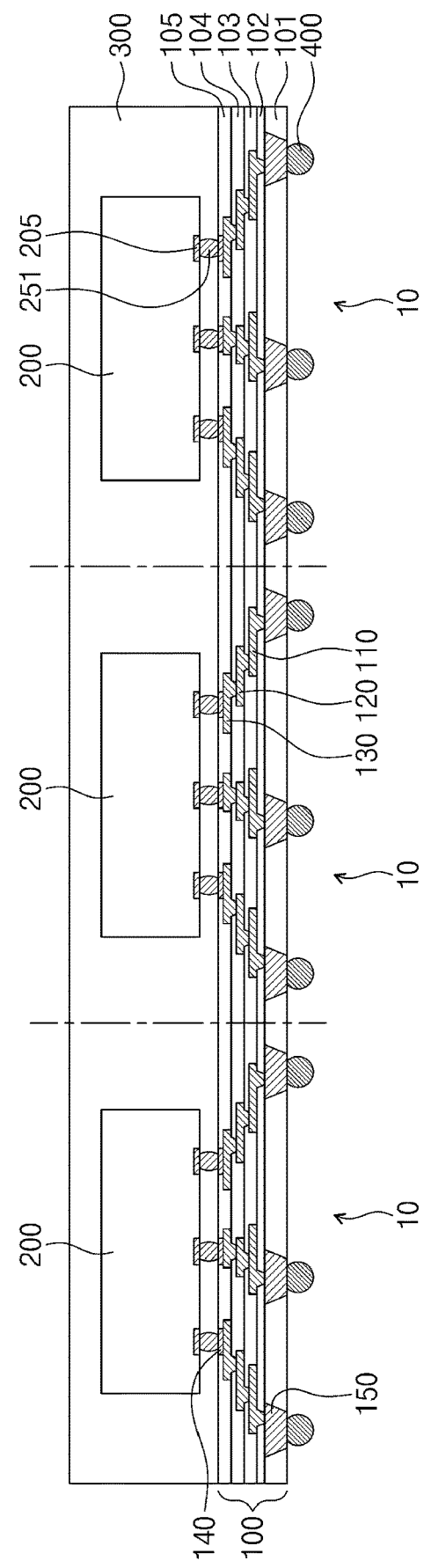

FIGS. 3A and 3B illustrate cross-sectional views showing a method of fabricating a semiconductor package according to some example embodiments. A duplicate description will be omitted below.

Referring to FIG. 3A, the redistribution substrate 100 may be formed on the carrier substrate 900. The redistribution substrate 100 may include the under-bump pattern 150; the first, second, third, fourth, and fifth dielectric layers 101, 102, 103, 104, and 105; the first, second, and third redistribution patterns 110, 120, and 130; and the conductive pads 140. The lower seed layer 151 may be formed between the carrier substrate 900 and the first dielectric layer 101 and between the carrier substrate 900 and the under-bump patterns 150. For example, the lower seed layer 151 may be formed between the release layer 910 and the redistribution substrate 100. The formation of the lower seed layer 151 and the redistribution substrate 100 may be substantially the same as that discussed above in FIGS. 1A to 1N. In contrast, the redistribution substrate 100 may be formed at a panel or wafer level.

The semiconductor chip 200 may be provided on the redistribution substrate 100. In this case, the semiconductor chip 200 may be provided in plural, and the plurality of semiconductor chips 200 may be disposed laterally spaced apart from each other. The first connectors 251 may be formed between corresponding conductive pads 140 and corresponding chip pads 205. The molding layer 300 may be provided on a top surface of the redistribution substrate 100, and thus the semiconductor chips 200 may be covered with the molding layer 300. For example, the molding layer 300 may be formed between neighboring semiconductor chips 200. Afterwards, the carrier substrate 900 and the release layer 910 may be removed to expose the lower seed layer 151. The lower seed layer 151 may be etched to expose the bottom surface of the first dielectric layer 101 and the bottom surface of the under-bump pattern 150.

Referring to FIG. 3B, the external terminals 400 may be formed on the exposed bottom surface of the under-bump pattern 150, and may be coupled to the under-bump pattern 150. The molding layer 300 and the redistribution substrate 100 may be diced along dot-and-dash lines to separate a plurality of semiconductor packages 10 from each other. In this description, the semiconductor packages 10 may be fabricated at a chip, panel, or wafer level.

The following will discuss a single semiconductor package for brevity of description, but a method of fabricating a semiconductor package is not limited to chip-level fabrication.

Figure 4:
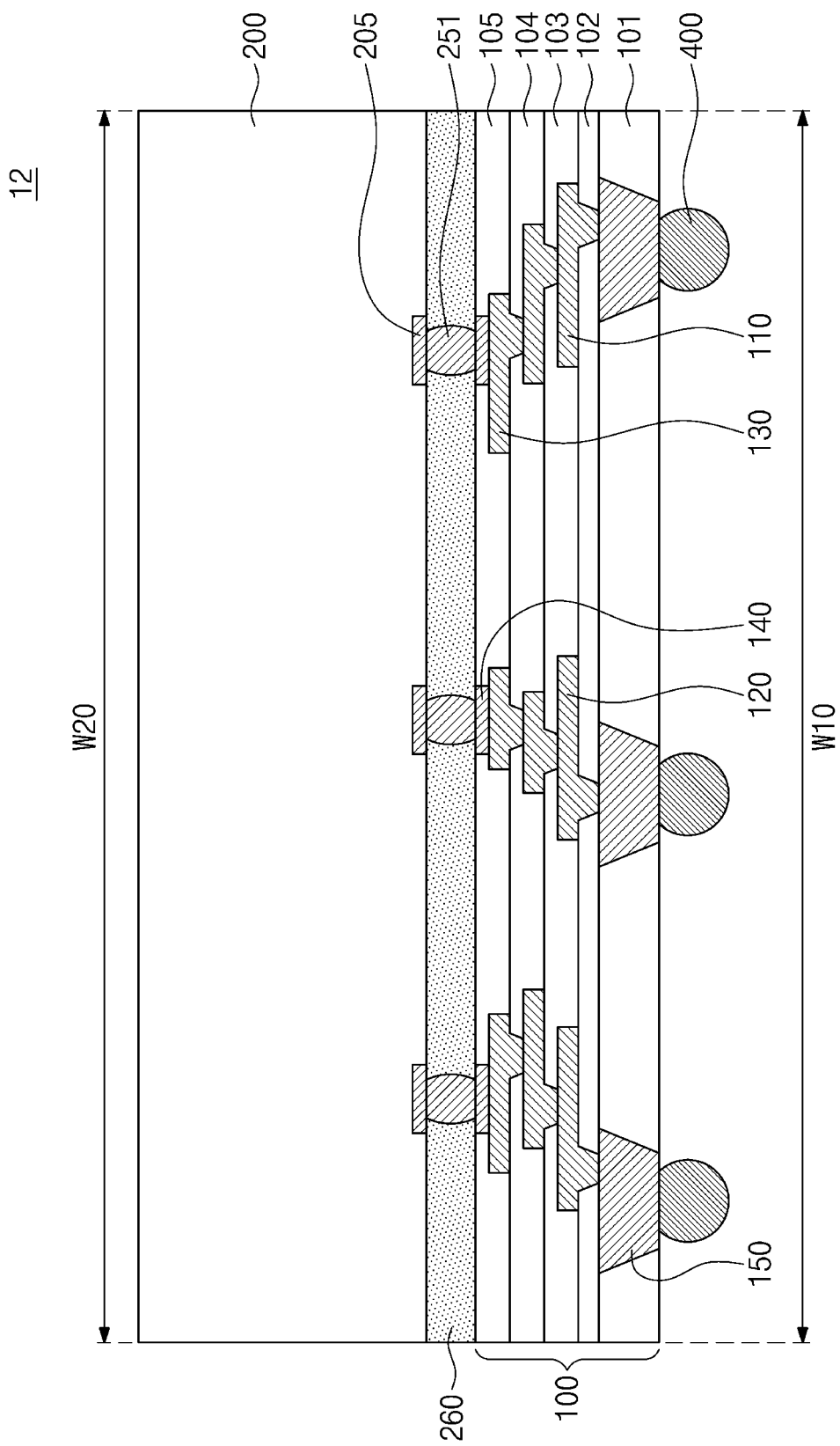
FIG. 4 illustrates a cross-sectional view showing a semiconductor package according to some example embodiments.

FIG. 4 illustrates a cross-sectional view showing a semiconductor package according to some example embodiments. A duplicate description will be omitted below.

Referring to FIG. 4, a semiconductor package 12 may include the redistribution substrate 100 and the semiconductor chip 200. The first connectors 251 may be interposed between the conductive pads 140 and the chip pads 205 of the semiconductor chip 200. An under-fill pattern 260 may be provided in a gap between the redistribution substrate 100 and the semiconductor chip 200, encapsulating the first connectors 251. The under-fill pattern 260 may include a dielectric polymer, such as an epoxy-based polymer. The external terminals 400 may be disposed on the bottom surface of the under-bump pattern 150.

The formation of the redistribution substrate 100, the mounting of the semiconductor chip 200, and the formation of the external terminals 400 may be substantially the same as those discussed above in FIGS. 1A to 1R. Differently from that discussed in FIGS. 1O and 1P, in some embodiments, the formation of the molding layer 300 may be skipped. The semiconductor chip 200 may have a width W20 substantially the same as a width W10 of the redistribution substrate 100. The semiconductor package 12 may be a fan-in semiconductor package.

Figure 5:
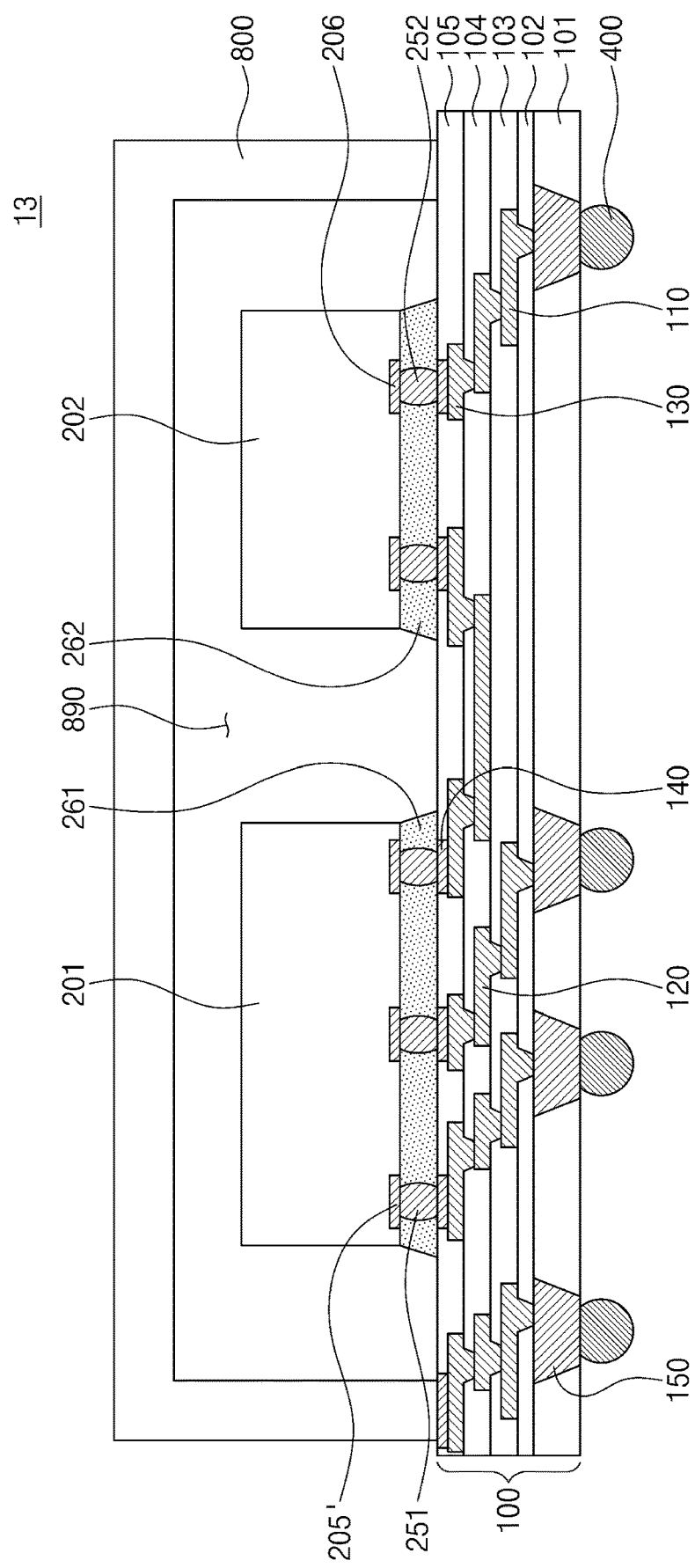
FIG. 5 illustrates a cross-sectional view showing a semiconductor package according to some example embodiments.

FIG. 5 illustrates a cross-sectional view showing a semiconductor package according to some example embodiments. FIG. 1R will be referred in explaining the following embodiment, and a duplicate discussion will be omitted.

Referring to FIG. 5, a semiconductor package 13 may include the redistribution substrate 100, the external terminals 400, a first semiconductor chip 201, a second semiconductor chip 202, and a housing 800. The redistribution substrate 100 and the external terminals 400 may be substantially the same as those discussed above. The semiconductor package 13 may be a system-in-package (SIP).

The first semiconductor chip 201 may be mounted on the top surface of the redistribution substrate 100. For example, the first connectors 251 may be formed between chip pads 205' of the first semiconductor chip 201 and corresponding conductive pads 140. The first semiconductor chip 201 and the first connectors 251 may be substantially the same as the semiconductor chip 200 and the first connectors 251, respectively, discussed in FIGS. 1Q and 1R.

On the top surface of the redistribution substrate 100, the second semiconductor chip 202 may be disposed spaced apart from the first semiconductor chip 201. The second semiconductor chip 202 may be of a different type from the first semiconductor chip 201. For example, the first semiconductor chip 201 may be one of a logic chip, a memory chip, a system-on-chip (SOC), an application processor (AP) chip, and a microelectromechanical system (MEMS) chip, and the second semiconductor chip 202 may be another of a logic chip, a memory chip, a system-on-chip (SOC), an application processor (AP) chip, and a microelectromechanical system (MEMS) chip. Second connectors 252 may be interposed between chip pads 206 of the second semiconductor chip 202 and corresponding conductive pads 140, and may be coupled to the second semiconductor chip 202 and the redistribution substrate 100. The second connectors 252 may include one or more of a solder ball, a bump, and a pillar. The second connectors 252 may include a conductive material.

A first under-fill pattern 261 may be provided in a gap between the redistribution substrate 100 and the first semiconductor chip 201, encapsulating the first connectors 251. A second under-fill pattern 262 may be provided in a gap between the redistribution substrate 100 and the second semiconductor chip 202, encapsulating the second connectors 252. The first under-fill pattern 261 and the second under-fill pattern 262 may include a dielectric polymer, such as an epoxy-based polymer.

The housing 800 may be disposed on the redistribution substrate 100. The housing 800 may be disposed spaced apart from the first and second semiconductor chips 201 and 202. A cavity 890 may be provided between the first semiconductor chip 201 and the housing 800 and between the second semiconductor chip 202 and the housing 800. A gas, such as air, may occupy the cavity 890. The housing 800 may protect the first and second semiconductor chips 201 and 202 from external environment. For example, the housing 800 may prevent introduction of foreign substances or may absorb physical impact. The housing 800 may include a material whose thermal conductivity is high, and may serve as a heat sink or a heat slug. For example, when the semiconductor package 13 operates, the housing 800 may promptly externally discharge heat generated from one or more of the redistribution substrate 100, the first semiconductor chip 201, and the second semiconductor chip 202. The housing 800 may include a conductive material, such as metal. In this case, the housing 800 may have an electrical conductivity and may act as an electromagnetic shield layer. For example, the housing 800 may shield electromagnetic interference (EMI) for the first and second semiconductor chips 201 and 202. The housing 800 may be electrically grounded through the redistribution substrate 100, and may prevent the first semiconductor chip 201 and/or the second semiconductor chip 202 from being electrically damaged, including that caused by electrostatic discharge (ESD). Alternatively, the housing 800 may include a dielectric material. For example, the housing 800 may include a dielectric polymer.

The formation of the redistribution substrate 100, the mounting of the first semiconductor chip 201, and the formation of the external terminals 400 may be substantially the same as those discussed above in FIGS. 1A to 1R. Differently from that discussed in FIGS. 1O and 1P, the formation of the molding layer 300 may be skipped, and the second semiconductor chip 202 and the housing 800 may further be disposed on the redistribution substrate 100.

Although not shown, a third semiconductor chip may further be mounted on the redistribution substrate 100.

Figure 6A:
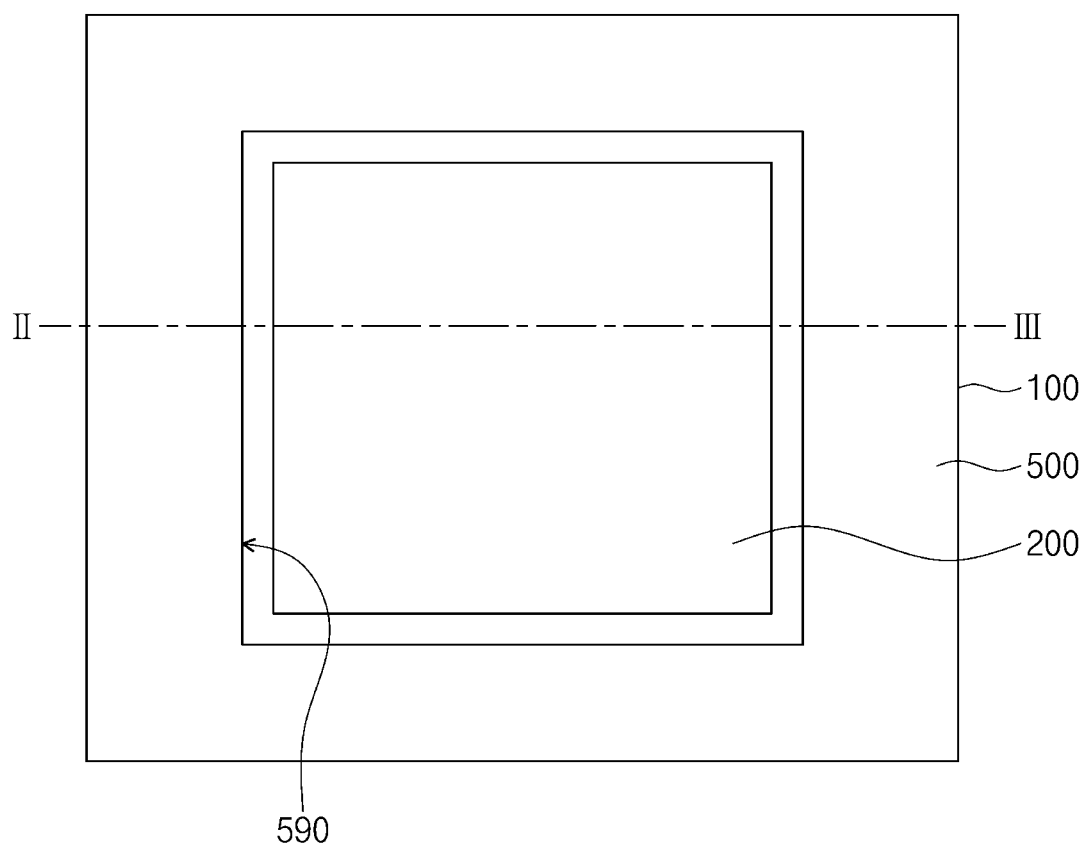
FIG. 6A illustrates a plan view showing a semiconductor package according to some example embodiments.
Figure 6B:
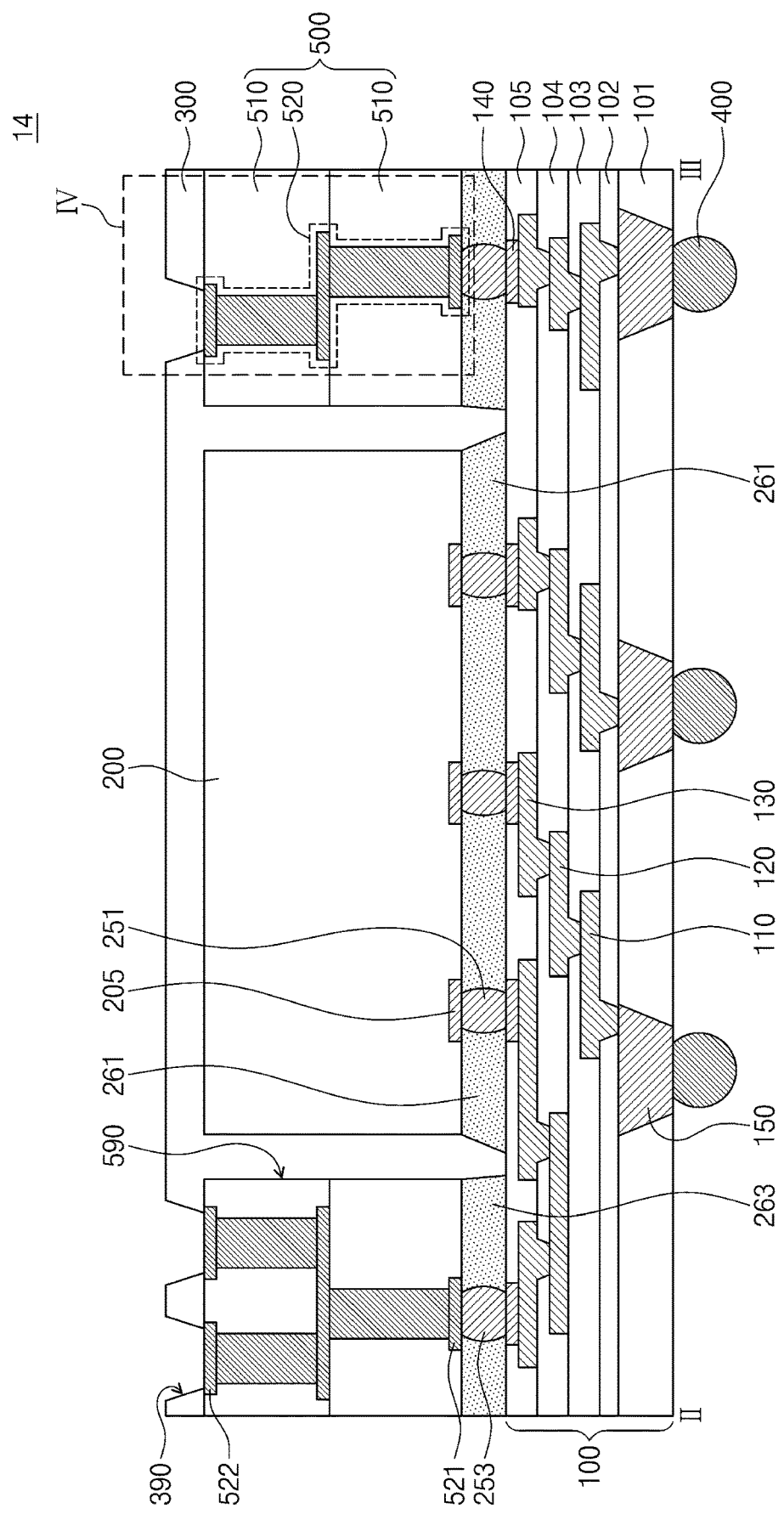
FIG. 6B illustrates a cross-sectional view taken along line II-III of FIG. 6A.
Figure 6C:
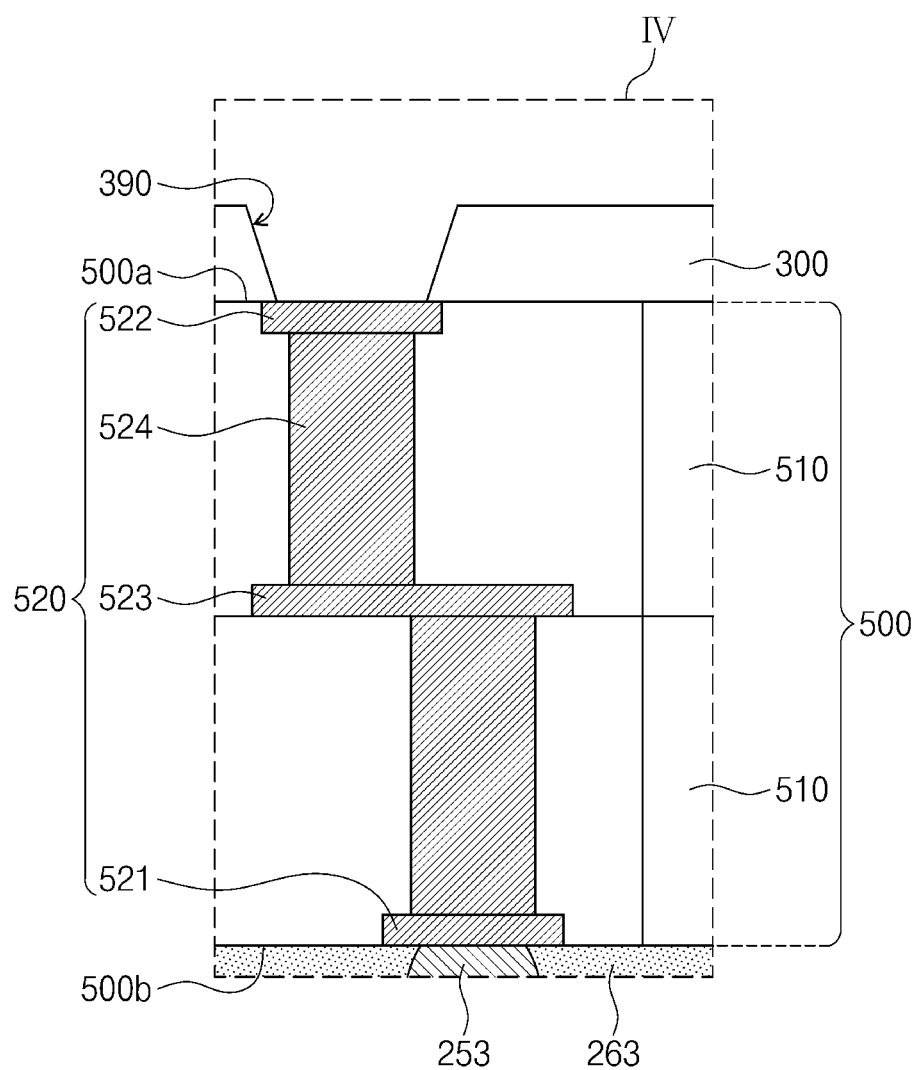
FIG. 6C illustrates an enlarged view showing section IV of FIG. 6B.

FIG. 6A illustrates a plan view showing a semiconductor package according to some example embodiments. FIG. 6B illustrates a cross-sectional view taken along line II-III of FIG. 6A. FIG. 6C illustrates an enlarged view showing section IV of FIG. 6B.

Referring to FIGS. 6A, 6B, and 6C, a semiconductor package 14 may include the redistribution substrate 100, the semiconductor chip 200, a connection substrate 500, and the molding layer 300. The fabrication of the redistribution substrate 100, the mounting of the semiconductor chip 200, the formation of the molding layer 300, and the formation of the external terminals 400 may be substantially the same as those discussed above in FIGS. 1A to 1R. In contrast, when viewed in plan, the semiconductor chip 200 may be disposed on a central region of the redistribution substrate 100, and the connection substrate 500 may further be disposed before the formation of the molding layer 300 discussed in FIGS. 1O and 1P.

The connection substrate 500 may be disposed on the redistribution substrate 100. The arrangement of the connection substrate 500 may be performed before or after the arrangement of the semiconductor chip 200. The connection substrate 500 may have a hole 590 penetrating therethrough. For example, the hole 590 may be formed to penetrate top and bottom surface of a printed circuit board (PCB), and the printed circuit board having the hole 590 may be used as the connection substrate 500. When viewed in plan, the hole 590 may be formed on the central region of the redistribution substrate 100. The semiconductor chip 200 may be provided in the hole 590 of the connection substrate 500. The connection substrate 500 may include a base layer 510 and a conductive structure 520. The base layer 510 may include a plurality of stacked base layers 510. The base layers 510 may include a dielectric material. For example, the base layers 510 may include a carbon-based material, a ceramic, or a polymer. The hole 590 may penetrate the base layers 510. The conductive structure 520 may be provided in the base layers 510. As shown in FIG. 6C, the conductive structure 520 may include a first pad 521, a conductive line 523, vias 524, and a second pad 522. The first pad 521 may be exposed on a bottom surface 500b of the connection substrate 500, and may be coupled to one of the vias 524.

The conductive line 523 may be interposed between the base layers 510. The vias 524 may penetrate the base layers 510 to come into connection with the conductive line 523. The second pad 522 may be exposed on a top surface 500a of the connection substrate 500, and may be coupled to one of the vias 524. The second pad 522 may be electrically connected to the first pad 521 through the vias 524 and the conductive line 523. The second pad 522 may not be vertically aligned with the first pad 521. For example, the second pad 522 may be offset vertically from the first pad 521. The number of second pads 522 may be different from the number of first pads 521. The conductive structure 520 may include metal. The conductive structure 520 may include, for example, one or more of copper, aluminum, gold, lead, stainless steel, silver, iron, and an alloy thereof.

As shown in FIG. 6B, a third connector 253 may be interposed between and coupled to the first pad 521 and a corresponding one of the conductive pads 140. The conductive structure 520 may be electrically connected through the third connector 253 to the redistribution substrate 100. The third connector 253 may include a conductive material. The third connector 253 may include one or more of a solder ball, a bump, and a pillar. A third under-fill pattern 263 may be provided in a gap between the redistribution substrate 100 and the connection substrate 500, encapsulating the third connector 253.

Each of the first connectors 251 may be interposed between one of the chip pads 205 and a corresponding one of the conductive pads 140. The first under-fill pattern 261 may encapsulate the first connectors 251. The semiconductor chip 200 may be electrically connected to the conductive structure 520 through one or more of the redistribution patterns 110, 120, and 130.

The molding layer 300 may be provided on the semiconductor chip 200 and the connection substrate 500. For example, the molding layer 300 may cover top surfaces of the semiconductor chip 200 and the connection substrate 500. The molding layer 300 may extend into and fill a gap between the semiconductor chip 200 and the connection substrate 500. The molding layer 300 may include a dielectric polymer, such as an epoxy-based polymer. In some embodiments, an adhesive dielectric film may be attached to a top surface of the connection substrate 500, a top surface of the semiconductor chip 200, and a sidewall of the semiconductor chip 200, thereby forming the molding layer 300. For example, an Ajinomoto build-up film (ABF) may be used as the adhesive dielectric film. In some embodiments, the first under-fill pattern 261 may not be formed, and the molding layer 300 may further extend into a gap between the redistribution substrate 100 and the semiconductor chip 200. In some embodiments, the third under-fill pattern 263 may not be formed, and the molding layer 300 may further extend into a gap between the redistribution substrate 100 and the connection substrate 500. The molding layer 300 may be provided therein with upper holes 390 exposing the second pads 522 of the conductive structure 520. In some embodiments, a width of the upper hole 390 may gradually decrease as it nears the second pad 522. For example, the upper hole 390 may have a width that is wider near the upper surface of the molding layer 300 and narrower near the second pad 522.

A plurality of external terminals 400 may be correspondingly provided on a plurality of under-bump patterns 150. One or more of the external terminals 400 may be electrically connected through the redistribution patterns 110, 120, and 130 to the semiconductor chip 200, and another one or more of the external terminals 400 may be electrically connected through the redistribution patterns 110, 120, and 130 to the electrically connected through the redistribution patterns 110, 120, and 130 to the conductive structure 520.

Figure 6D:
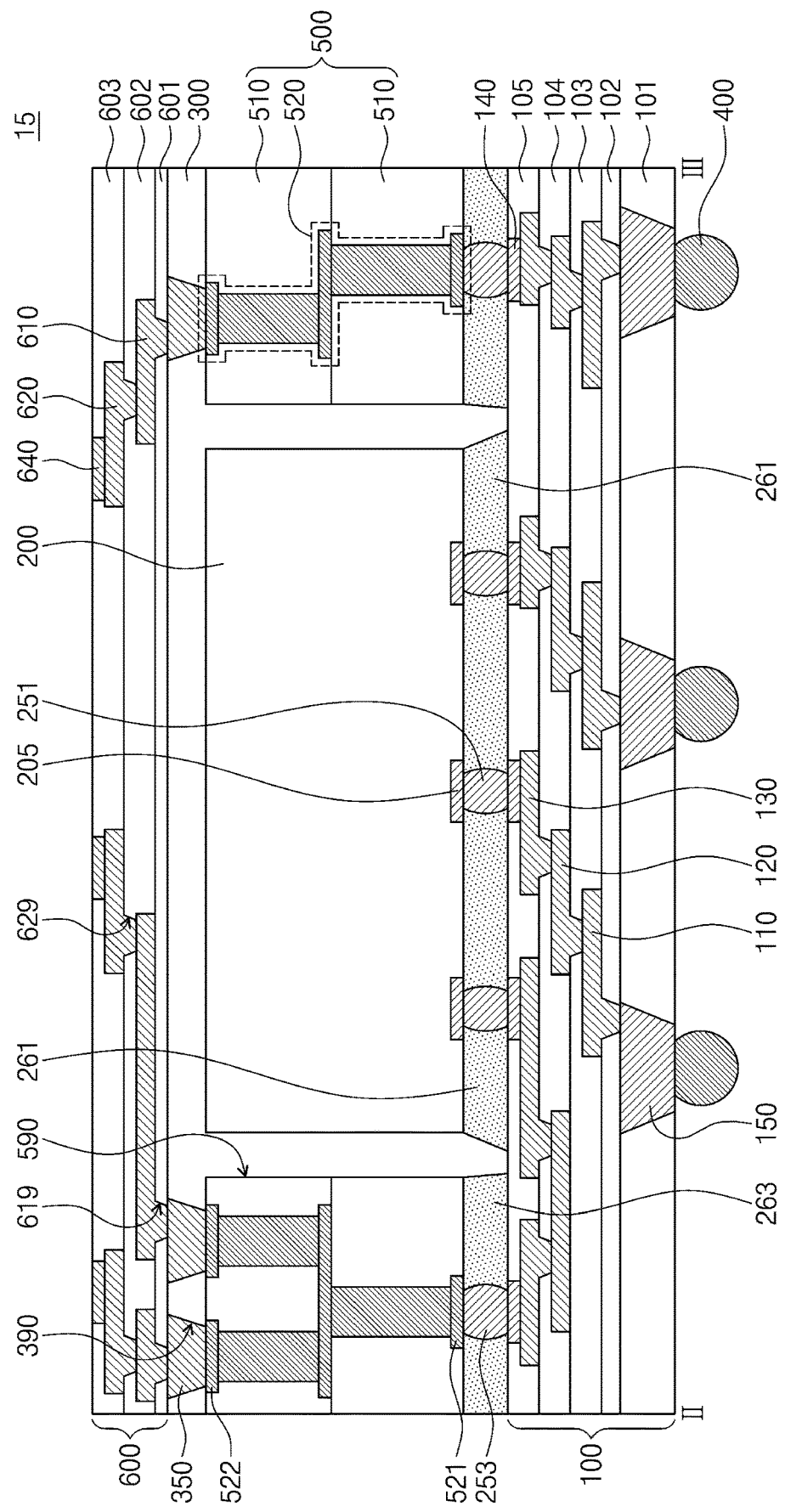
FIG. 6D illustrates a cross-sectional view showing a semiconductor package according to some example embodiments.

FIG. 6D illustrates a cross-sectional view taken along line II-III of FIG. 6A, showing a semiconductor package according to some example embodiments. A duplicate description will be omitted below.

Referring to FIGS. 6A and 6D, a semiconductor package 15 may include the redistribution substrate 100, the external terminals 400, the semiconductor chip 200, the connection substrate 500, and the molding layer 300, and further include an upper redistribution layer 600. According to some embodiments, each of the upper holes 390 may be provided therein with a conductor 350 filling the upper hole 390. The conductor 350 may include, for example, metal. In some embodiments, a width of the conductor 350 may gradually decrease as it nears the second pad 522. For example, the conductor 350 may have a width that is wider near the upper surface of the molding layer 300 and narrower near the second pad 522.

The upper redistribution layer 600 may be provided on a top surface of the molding layer 300. The upper redistribution layer 600 may include a first upper dielectric layer 601, a second upper dielectric layer 602, a third upper dielectric layer 603, a first upper redistribution pattern 610, a second upper redistribution pattern 620, and an upper conductive pad 640. The first upper dielectric layer 601 may be provided on the molding layer 300. The first upper dielectric layer 601 may include a photosensitive polymer. The first upper dielectric layer 601 may have first upper openings 619 that expose the conductors 350. The first upper redistribution pattern 610 may be provided on the first upper dielectric layer 601 and in the first upper openings 619. The first upper redistribution pattern 610 may include metal, such as copper. The first upper redistribution pattern 610 may be coupled to the conductor 350. The second upper dielectric layer 602 may be provided on the first upper dielectric layer 601. The second upper dielectric layer 602 may include a photosensitive polymer. The second upper dielectric layer 602 may have second upper openings 629 that expose the first upper redistribution pattern 610. The second upper redistribution pattern 620 may be provided on a top surface of the second upper dielectric layer 602 and in the second upper openings 629. The second upper redistribution pattern 620 may be coupled to the first upper redistribution pattern 610. The second upper redistribution pattern 620 may include metal, such as copper. The upper conductive pads 640 may be formed on a top surface of the second upper redistribution pattern 620, and may be coupled to the second upper redistribution pattern 620. The upper conductive pads 640 may be coupled to the conductive structure 520 through the first and second upper redistribution patterns 610 and 620 and the conductor 350. The upper conductive pads 640 may not be vertically aligned with the conductor 350.

The third upper dielectric layer 603 may be formed on the second upper dielectric layer 602 and the second upper redistribution pattern 620. The third upper dielectric layer 603 may include a dielectric material. The third upper dielectric layer 603 may expose top surfaces of the upper conductive pads 640.

The fabrication of the redistribution substrate 100, the mounting of the semiconductor chip 200, the formation of the molding layer 300, and the formation of the external terminals 400 may be performed by methods substantially the same as those discussed above in FIGS. 1A to 1R, 6A, 6B, and 6C. In contrast, in some embodiments, after the formation of the connection substrate 500 and the molding layer 300 in the step illustrated in FIGS. 6B and 6C, the upper holes 390 and the upper redistribution layer 600 may further be formed.

Figure 6E:
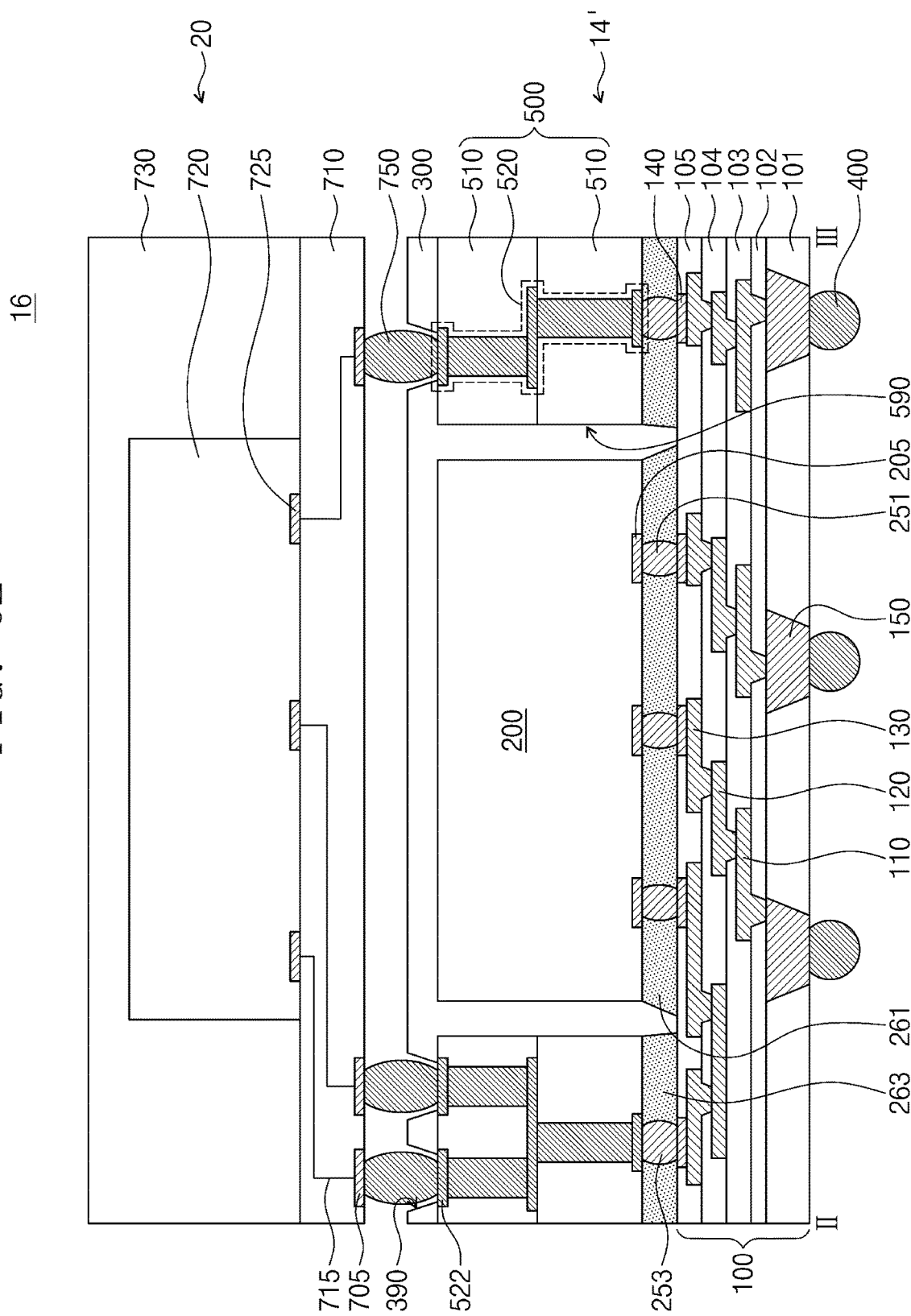
FIG. 6E illustrates a cross-sectional view showing a semiconductor package according to some example embodiments.

FIG. 6E illustrates a cross-sectional view taken along line II-III of FIG. 6A, showing a semiconductor package according to some example embodiments.

Referring to FIGS. 6A and 6E, a semiconductor package 16 may include a first semiconductor package 14' and a second semiconductor package 20. The semiconductor package 14 discussed in FIGS. 6A to 6C may be used as the first semiconductor package 14'. For example, the first semiconductor package 14' may include the redistribution substrate 100, the semiconductor chip 200, the connection substrate 500, and the molding layer 300.

The second semiconductor package 20 may be disposed on the first semiconductor package 14'. The second semiconductor package 20 may include a package substrate 710, an upper semiconductor chip 720, and an upper molding layer 730. The package substrate 710 may be a printed circuit board. Metal pads 705 may be disposed on a bottom surface of the package substrate 710. Alternatively, the package substrate 710 may be a redistribution layer. For example, the second semiconductor package 20 may be the semiconductor package 10 fabricated as illustrated above in FIGS. 1A to 1R. In this case, the metal pads 705 may have substantially the same shape and arrangement as those of the under-bump pattern 150 discussed above in FIGS. 1A to 1R.

The upper semiconductor chip 720 may be disposed on the package substrate 710. The upper semiconductor chip 720 may include integrated circuits, and the integrated circuits may include a memory circuit, a logic circuit, or a combination thereof. The upper semiconductor chip 720 may be of a different type from the semiconductor chip 200. The upper semiconductor chip 720 may be electrically connected to the metal pad 705 through connection lines 715 in the package substrate 710. For example, the connection lines 715 may be connected to the upper chip pads 725 of the upper semiconductor chip 720 to connect the upper semiconductor chip 720 to the metal pad 705. In FIG. 6E, the connection lines 715 are schematically illustrated, and the shape and arrangement of the connection lines 715 may be variously changed. The package substrate 710 may be provided thereon with the upper molding layer 730 covering the upper semiconductor chip 720. The upper molding layer 730 may include a dielectric polymer, such as an epoxy-based polymer.

A connection terminal 750 may be provided in each of the upper holes 390 of the molding layer 300. The second pads 522 and the metal pads 705 may be electrically connected to each other through the connection terminals 750 interposed therebetween. In such cases, the second semiconductor package 20 may be electrically connected through the connection terminals 750 to the semiconductor chip 200 and the external terminals 400. The electrical connection of the second semiconductor package 20 may include electrical connection with integrated circuits in the upper semiconductor chip 720. According to some embodiments, because the connection substrate 500 is provided, the connection terminals 750 may be freely arranged. For example, the number and arrangement of the connection terminals 750 may not be restricted by the number and arrangement of the first pads 521. As a result, the connection lines 715 may be freely designed in the package substrate 710, and integrated circuits may also be freely designed in the upper semiconductor chip 720.

In some embodiments, the semiconductor package 15 discussed in FIG. 6D may be used as the first semiconductor package 14'. For example, the first semiconductor package 14' may include the redistribution substrate 100, the semiconductor chip 200, the connection substrate 500, and the molding layer 300, and further include the upper redistribution layer 600. In this case, the connection terminals 750 may be interposed between the upper conductive pads 640 and the metal pads 705. Because the upper redistribution layer 600 is provided, the connection terminals 750 may be freely arranged.

Figure 7A:
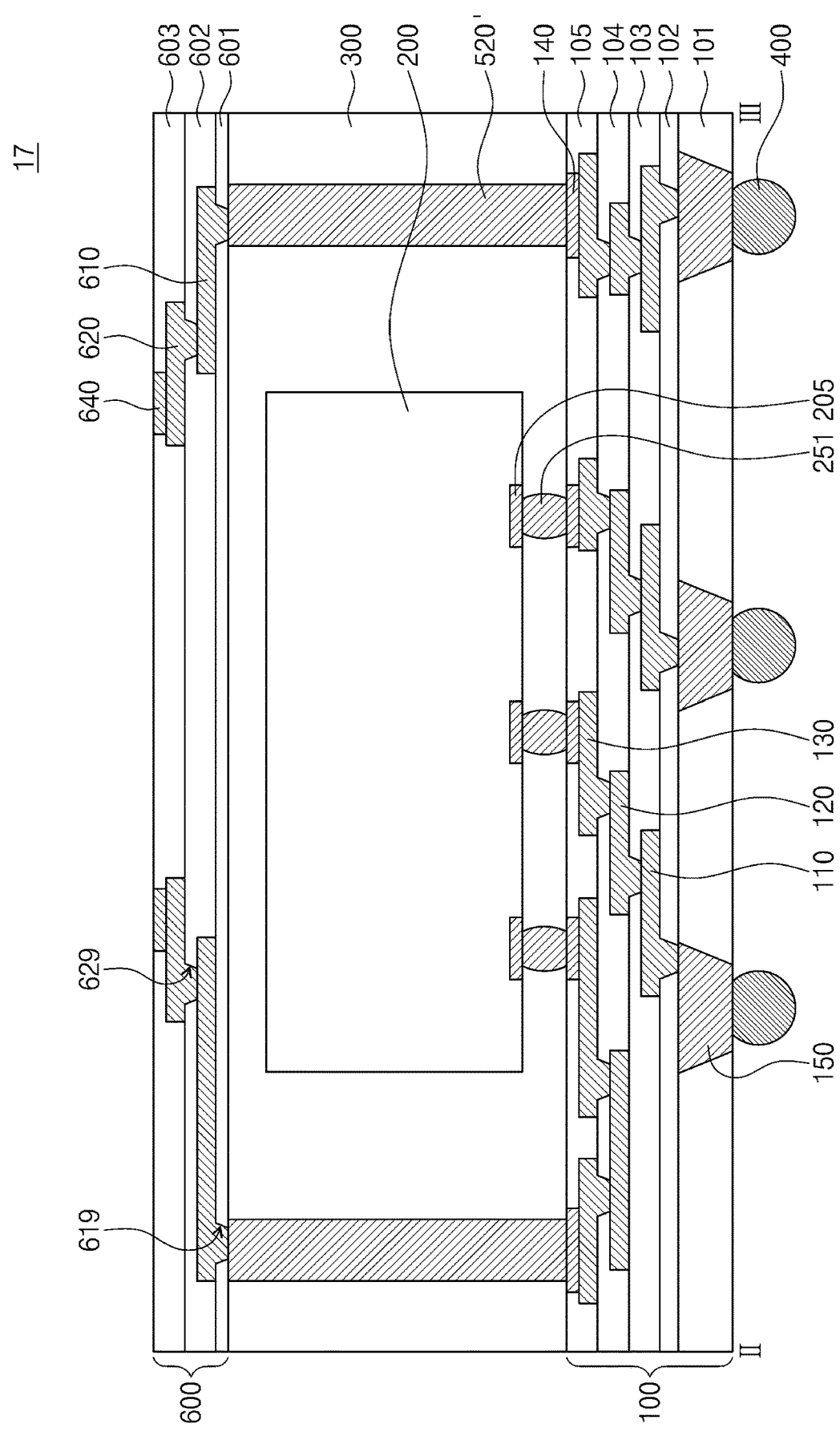
FIG. 7A illustrates a cross-sectional view showing a semiconductor package according to some example embodiments.

FIG. 7A illustrates a cross-sectional view showing a semiconductor package according to some example embodiments. A duplicate description will be omitted below.

Referring to FIG. 7A, a semiconductor package 17 may include the redistribution substrate 100, the semiconductor chip 200, the external terminals 400, and the molding layer 300, and further include a conductive structure 520' and an upper redistribution layer 600.

The connection substrate 500, which is discussed in FIGS. 6A to 6E, may not be provided. Instead of the connection substrate 500, the conductive structure 520' may be formed in which a metal pillar is provided on the redistribution substrate 100. For example, the conductive structure 520' may include the metal pillar. The conductive structure 520' may be spaced apart from the semiconductor chip 200. The conductive structure 520' may be electrically connected to the redistribution substrate 100.

The redistribution substrate 100 may be provided thereon with the molding layer 300 covering the semiconductor chip 200. The molding layer 300 may cover a sidewall of the conductive structure 520', but may expose a top surface of the conductive structure 520'.

The upper redistribution layer 600 may be substantially the same as the upper redistribution layer 600 of FIG. 6D. For example, the upper redistribution layer 600 may include the first, second, and third upper dielectric layers 601, 602, and 603, the first and second upper redistribution patterns 610 and 620, and the upper conductive pad 640. In contrast, the first upper opening 619 of the first upper dielectric layer 611 may expose the top surface of the conductive structure 520'. The first upper redistribution pattern 610 may be provided in the first upper opening 619 and on the first upper dielectric layer 611. The first upper redistribution pattern 610 may contact the top surface of the conductive structure 520', and may have electrical connection with the conductive structure 520'.

The fabrication of the redistribution substrate 100, the mounting of the semiconductor chip 200, the formation of the molding layer 300, and the formation of the external terminals 400 may be performed by methods substantially the same as those discussed above in FIGS. 1A to 1R. In contrast, the conductive structure 520' and the upper redistribution layer 600 may further be formed in the step illustrated in FIGS. 1O and 1P. The formation of the conductive structure 520' and the upper redistribution layer 600 may be followed by the formation of the external terminals 400.

In some embodiments, the semiconductor package 17 may not include the upper redistribution layer 600.

Figure 7B:
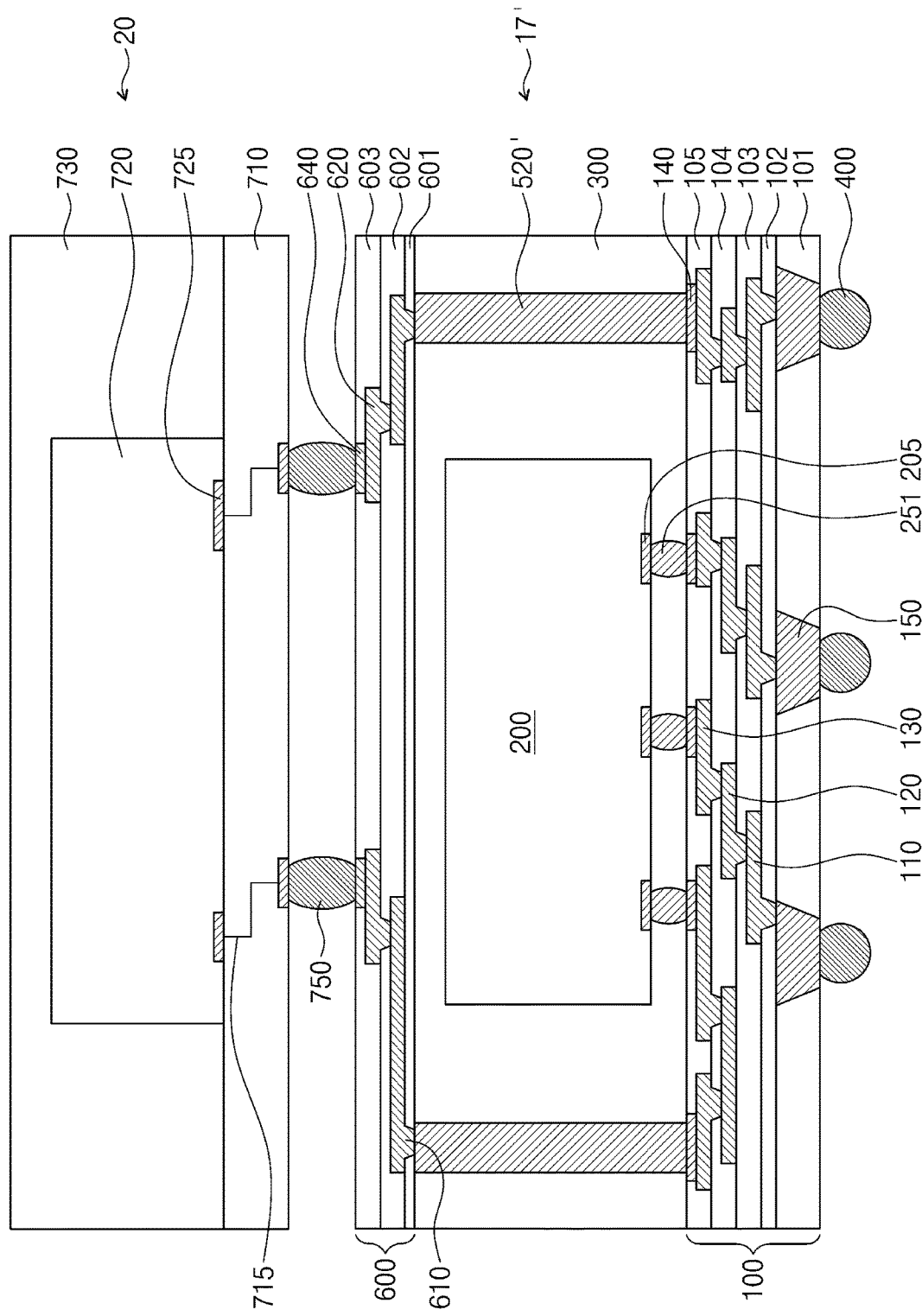
FIG. 7B illustrates a cross-sectional view showing a semiconductor package according to some example embodiments.

FIG. 7B illustrates a cross-sectional view showing a semiconductor package according to some example embodiments. A duplicate description will be omitted below.

Referring to FIG. 7B, a semiconductor package 18 may include a first semiconductor package 17' and a second semiconductor package 20. The semiconductor package 17 discussed in FIG. 7A may be used as the first semiconductor package 17'. For example, the first semiconductor package 17' may include the redistribution substrate 100, the semiconductor chip 200, the molding layer 300, the conductive structure 520', and the upper redistribution layer 600.

The second semiconductor package 20 may be disposed on the first semiconductor package 17'. The second semiconductor package 20 may be substantially the same as the second semiconductor package 20 discussed in FIG. 6E. For example, the second semiconductor package 20 may include the package substrate 710, the upper semiconductor chip 720, and the upper molding layer 730.

The upper conductive pads 640 and the metal pads 705 may be electrically connected to each other through the connection terminals 750 interposed therebetween. The upper semiconductor chip 720 may be electrically connected to the redistribution substrate 100 through the connection terminals 750, the upper redistribution patterns 610 and 620, and the conductive structure 520'. Because the upper redistribution layer 600 is provided, the connection terminals 750 may be freely disposed. For example, the connection terminals 750 may be provided in plural, and when viewed in plan, at least one of the plurality of connection terminals 750 may overlap the semiconductor chip 200.

In some embodiments, the first semiconductor package 17' may not include the upper redistribution layer 600. In this case, the connection terminal 750 may be aligned with and coupled to the conductive structure 520' and the metal pad 705.

In explaining FIGS. 3A, 3B, 4, 5, 6A to 6E, 7A, and 7B, although not shown, the under-bump pattern 150 and the external terminals 400 may further be provided therebetween with one or more of the first lower under-bump pattern 152 and the second lower under-bump pattern 153 that are discussed in FIGS. 2A to 2F.

According to the present inventive concepts, an under-bump pattern may have a relatively large thickness and thus a semiconductor package may increase in reliability and durability. Because the under-bump pattern is formed in a first opening that is defined by a first dielectric layer, it may be possible to skip the formation and removal of a resist pattern. In addition, it may also be to simplify fabrication processes of the semiconductor package. The first dielectric layer may have a flat top surface. Therefore, line parts of redistribution patterns may be located at the same level or similar levels. A redistribution substrate may increase in reliability.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
a redistribution substrate; and
a semiconductor chip on a top surface of the redistribution substrate,
wherein the redistribution substrate includes:
an under-bump pattern;
a lower dielectric layer that covers a sidewall of the under-bump pattern; and
a first redistribution pattern on the lower dielectric layer,
wherein the first redistribution pattern includes:
a first conductive layer on a top surface of the lower dielectric layer and including a first tapered via part and a first line part, the first line part extending in a horizontal direction and connected to the first tapered via part; and
a first seed layer between the top surface of the lower dielectric layer and the first conductive layer, the first seed layer covering a bottom surface and side surfaces of the first tapered via part and a bottom surface of the first line part,
wherein a bottom surface of the seed layer covering the first tapered via part directly contacts a top surface of the under-bump pattern,
wherein the top surface of the under-bump pattern is at a vertical level the same as or less than that of the top surface of the lower dielectric layer,
wherein a width at the top surface of the under-bump pattern is greater than a width at a bottom surface of the under-bump pattern,
wherein the under-bump pattern narrows from the top surface of the under-bump pattern to the bottom surface of the under-bump pattern to form a tapered shape having a side surface that extends linearly from the top surface of the under-bump pattern to the bottom surface of the under-bump pattern, and
wherein a thickness of the under-bump pattern is greater than a thickness of the first line part.

2. The semiconductor package of claim 1, wherein a width of the first tapered via part is less than the width at the top surface of the under-bump pattern.

3. The semiconductor package of claim 1, wherein the thickness of the under-bump pattern is 2.5 to 10 times the thickness of the first line part.

4. The semiconductor package of claim 1,
wherein the first line part includes a plurality of first line parts that are spaced apart from each other, and
wherein a maximum interval between a bottom surface of the lower dielectric layer and bottom surfaces of the first line parts is 100% to 130% of a minimum interval between the bottom surface of the lower dielectric layer and the bottom surfaces of the first line parts.

5. The semiconductor package of claim 1, further comprising:
an upper dielectric layer on the lower dielectric layer; and
a second redistribution pattern on a top surface of the upper dielectric layer, the second redistribution pattern including a second line part,
wherein the thickness of the under-bump pattern is greater than a thickness of the second line part.

6. The semiconductor package of claim 1, further comprising an external terminal on the bottom surface of the under-bump pattern.

7. The semiconductor package of claim 6, further comprising:
a lower under-bump pattern between the under-bump pattern and the external terminal; and
a seed pattern between the lower under-bump pattern and the under-bump pattern,
wherein the lower under-bump pattern includes a material different from a material of the under-bump pattern.

8. The semiconductor package of claim 1, further comprising:
a connection substrate on the redistribution substrate, the connection substrate including a plurality of base layers and a conductive structure,
wherein the connection substrate has a hole, and
wherein the semiconductor chip is disposed in the hole.

9. The semiconductor package of claim 1, further comprising:
a conductive structure on the top surface of the redistribution substrate, the conductive structure being spaced apart from the semiconductor chip; and a molding layer on the top surface of the redistribution substrate, the molding layer encapsulating the semiconductor chip and a sidewall of the conductive structure.

10. The semiconductor package of claim 1, further comprising:
a solder terminal,
wherein a bottom surface of the under-bump pattern is coplanar with a bottom surface of the dielectric layer, and
wherein the solder terminal contacts the bottom surface of the under-bump pattern.

11. A semiconductor package, comprising:
a redistribution substrate;
a semiconductor chip on a top surface of the redistribution substrate; and
a solder terminal on a bottom surface of the redistribution substrate,
wherein the redistribution substrate includes:
an under-bump pattern;
a dielectric layer that covers a sidewall of the under-bump pattern; and
a redistribution pattern on the under-bump pattern and on the dielectric layer, the redistribution pattern being coupled to the under-bump pattern,
wherein the solder terminal is on a bottom surface of the under-bump pattern,
wherein the redistribution pattern includes:
a conductive layer including a tapered via part and a line part, the line part extending in a horizontal direction and connected to the tapered via part; and
a seed layer covering a bottom surface and side surfaces of the tapered via part and a bottom surface of the line part, the seed layer being spaced apart from a top surface of the line part,
wherein the sidewall of the under-bump pattern is in direct contact with the dielectric layer,
wherein a top surface of the under-bump pattern is at a vertical level the same as or less than that of a top surface of the dielectric layer,
wherein a bottom surface of the seed layer covering the tapered via part directly contacts the top surface of the under-bump pattern,
wherein the seed layer includes different material from the under-bump pattern,
wherein an angle between the sidewall and a top surface of the under-bump pattern is an acute angle, and
wherein an angle between the sidewall and the bottom surface of the under-bump pattern is in a range from 105° to 135°.

12. The semiconductor package of claim 11,
wherein the sidewall extends linearly from the top surface of the under-bump pattern to the bottom surface of the under-bump pattern,
wherein the under-bump pattern narrows from the top surface of the under-bump pattern to the bottom surface of the under-bump pattern to form a tapered shape, and
wherein the dielectric layer exposes the bottom surface of the under-bump pattern.

13. The semiconductor package of claim 12, wherein the bottom surface of the under-bump pattern is coplanar with a bottom surface of the dielectric layer.

14. The semiconductor package of claim 11, wherein a width of the tapered via part is less than a width of the under-bump pattern.

15. The semiconductor package of claim 11,
wherein a bottom surface of the under-bump pattern is coplanar with a bottom surface of the dielectric layer, and
wherein the solder terminal contacts the bottom surface of the under-bump pattern.

16. A semiconductor package, comprising:
a redistribution substrate;
a semiconductor chip on a top surface of the redistribution substrate; and
a solder terminal on a bottom surface of the redistribution substrate,
wherein the redistribution substrate includes:
a conductive terminal pad;
a lower under-bump pattern provided on a bottom surface of the conductive terminal pad and including different material from the conductive terminal pad;
a lower dielectric layer that covers a sidewall of the conductive terminal pad;
a line pattern on the lower dielectric layer; and
a tapered via between the conductive terminal pad and the line pattern, the tapered via being in direct contact with a top surface of the conductive terminal pad,
wherein the top surface of the conductive terminal pad is at a vertical level the same as or less than that of a top surface of the lower dielectric layer,
wherein the conductive terminal pad narrows from the top surface of the conductive terminal pad to the bottom surface of the conductive terminal pad to form a tapered shape,
wherein a thickness of the conductive terminal pad is greater than a thickness of the line pattern, wherein the solder terminal is provided on a bottom surface of the lower under-bump pattern,
wherein a width of the tapered via is less than a width of the conductive terminal pad, and
wherein the lower under-bump pattern does not extend on a bottom surface of the lower dielectric layer.

17. The semiconductor package of claim 16, wherein an angle between the sidewall and the bottom surface of the conductive terminal pad is in a range from 105° to 135°.

18. The semiconductor package of claim 16, wherein the thickness of the conductive terminal pad is 2.5 to 10 times the thickness of the line pattern.

19. The semiconductor package of claim 16,
wherein the lower dielectric layer includes a first dielectric layer and a second dielectric layer that are stacked,
wherein the tapered via is provided in the second dielectric layer, and
wherein the line pattern is provided on a top surface of the second dielectric layer and is connected to the tapered via.

* * * * *